United States Patent
Kang et al.

(10) Patent No.: US 10,593,382 B2
(45) Date of Patent: Mar. 17, 2020

(54) MEMORY SYSTEMS AND DEVICES THAT SUPPORT CLOCK-TO-CLOCK ALIGNMENT, TRAINING AND METHODS OF OPERATING SAME

(71) Applicant: Samsung Electronics Co., Ltd., Suwon-si, Gyeonggi-do (KR)

(72) Inventors: Dong-Seok Kang, Suwon-si (KR); Byung-Chul Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 49 days.

(21) Appl. No.: 16/045,887

(22) Filed: Jul. 26, 2018

(65) Prior Publication Data
US 2019/0172509 A1 Jun. 6, 2019

(30) Foreign Application Priority Data
Dec. 5, 2017 (KR) .................. 10-2017-0166193

(51) Int. Cl.
*G11C 7/22* (2006.01)
*G06F 3/06* (2006.01)
*G11C 7/10* (2006.01)
*H03L 7/00* (2006.01)

(52) U.S. Cl.
CPC ............ *G11C 7/222* (2013.01); *G06F 3/0604* (2013.01); *G06F 3/0653* (2013.01); *G06F 3/0673* (2013.01); *G11C 7/1093* (2013.01); *H03L 7/00* (2013.01); *G11C 2207/2254* (2013.01)

(58) Field of Classification Search
CPC .............. G11C 7/222; G11C 7/1093; G11C 2207/2254; H03L 7/00; G06F 3/0604; G06F 3/0653; G06F 3/0673

USPC .......................................................... 711/154
See application file for complete search history.

(56) References Cited

U.S. PATENT DOCUMENTS

| | | | |
|---|---|---|---|
| 7,151,398 B2 | 12/2006 | Giguere et al. |
| 7,889,595 B2 | 2/2011 | Park |
| 8,106,690 B2 | 1/2012 | Sakaguchi et al. |
| 8,237,485 B2 | 8/2012 | Meng et al. |

(Continued)

FOREIGN PATENT DOCUMENTS

KR  10-2014-0064461  5/2014

*Primary Examiner* — Hiep T Nguyen
(74) *Attorney, Agent, or Firm* — Myers Bigel, P.A.

(57) ABSTRACT

A memory device performs first training including a plurality of loop operations to align a main clock signal and a data clock signal, which are received from a memory controller. A method of operating the memory device includes generating division ratio information indicating a division ratio set based on a frequency ratio of the main clock signal to the data clock signal and transmitting the division ratio information to the memory controller to perform the first training. A first loop operation includes: receiving first phase control information, which is generated based on the division ratio information, from the memory controller, dividing the data clock signal based on the division ratio to generate a division data clock signal, selecting a first phase from among a plurality of phases based on the first phase control information, generating a first comparison target clock signal that is shifted from the division data clock signal by the first phase, comparing a phase of the first comparison target clock signal with a phase of the main clock signal, and transmitting a first phase comparison result to the memory controller.

20 Claims, 27 Drawing Sheets

(56) References Cited

U.S. PATENT DOCUMENTS

| | | |
|---|---|---|
| 8,242,819 B2 | 8/2012 | Bae et al. |
| 9,553,592 B1 | 1/2017 | Sewani et al. |
| 2005/0268130 A1* | 12/2005 | Naruse ................... G06F 1/08 |
| | | 713/322 |
| 2012/0311251 A1* | 12/2012 | Best ................... G06F 13/1689 |
| | | 711/105 |
| 2015/0349781 A1 | 12/2015 | Torres |

* cited by examiner

TB1

| DRI | Division Ratio(DR) | |
|---|---|---|
| $V_1$ | 1:2 | ⎫ |
| $V_2$ | 1:4 | ⎬ DR_range |
| ⋮ | ⋮ | |
| $V_M$ | 1:M | ⎭ |

| DR | PCI | | Shift degree(SD) |
|---|---|---|---|
| 1:2 | $V_{11}(0)$ | 1 bit | 0° |
| | $V_{12}(1)$ | | 180° |

| DR | PCI | | Shift degree(SD) |
|---|---|---|---|
| 1:4 | $V_{21}(00)$ | 2 bit | 0° |
| | $V_{22}(01)$ | | 90° |
| | $V_{23}(10)$ | | 180° |
| | $V_{24}(11)$ | | 270° |

⋮

| DR | PCI | | Shift degree(SD) |
|---|---|---|---|
| 1:M | $V_{M1}$ | r bit | P1° (0°) |
| | $V_{M2}$ | | P2° |
| | ⋮ | | ⋮ |
| | $V_{Mn}$ | | Pn° |

FIG. 8B

| | PCI | | | Shift degree(SD) |
|---|---|---|---|---|
| Case1 (DR=1:2) | Case2 (DR=1:4) | 000 | Case3 (DR=1:8) | 0° |
| | | 001 | | 45° |
| | | 010 | | 90° |
| | | 011 | | 135° |
| | | 100 | | 180° |
| | | 101 | | 225° |
| | | 110 | | 270° |
| | | 111 | | 315° |

TB3

TB4

| Candidate Division Ratio(CDR) |
|---|
| 1:2 |
| 1:4 |
| ⋮ |
| 1:L |

⟵ Selecting as division ratio(DR)

MEMORY SYSTEMS AND DEVICES THAT SUPPORT CLOCK-TO-CLOCK ALIGNMENT, TRAINING AND METHODS OF OPERATING SAME

REFERENCE TO PRIORITY APPLICATION

This application claims the benefit of Korean Patent Application No. 10-2017-0166193, filed Dec. 5, 2017, in the Korean Intellectual Property Office, the disclosure of which is hereby incorporated herein in its entirety by reference.

BACKGROUND

The inventive concept relates to memory devices, and, more particularly, to memory devices configured to perform training for alignment between a main clock signal and a data clock signal, a memory system including the memory device, and a method of operating the memory device.

Semiconductor memory devices may be memory devices implemented by using semiconductors, such as silicon (Si), germanium (Ge), gallium arsenide (GaAs), and indium phosphide (InP). The semiconductor memory devices may be broadly classified into volatile memory devices and non-volatile memory devices. As a frequency band for transmitting and receiving data between a memory controller and a memory device increases, a data clock signal having a high frequency may be used to rapidly transmit and receive data. In addition, since it is difficult to increase an operation speed of a memory core included in the memory device due to a structure of the memory core to perform a memory operation, there is a technical limit to increasing a frequency of a main clock signal used to perform the memory operation. Thus, a difference in frequency between the main clock signal and the data clock signal is gradually increasing, and a frequency ratio between the main clock signal and the data clock signal that are provided from each memory controller may have various values. Therefore, research has been conducted into a method of operating a memory device capable of supporting training to enable elaborate alignment between the main clock signal and the data clock signal in an environment in which the frequency ratio of the main clock signal to the data clock signal is different according to each memory controller.

SUMMARY

The inventive concept provides a memory device configured to perform training for alignment between a main clock signal and a data clock signal based on a frequency ratio of the main clock signal to the data clock signal, a memory system including the memory device, and a method of operating the memory device.

According to an aspect of the inventive concept, there is provided a method of operating a memory device configured to perform first training including a plurality of loop operations to align a main clock signal and a data clock signal, which are received from a memory controller. The method includes generating division ratio information indicating a division ratio set based on a frequency ratio of the main clock signal to the data clock signal and transmitting the division ratio information to the memory controller to perform the first training. A first loop operation of the loop operations includes receiving first phase control information from the memory controller. The first phase control information is generated based on: the division ratio information, dividing the data clock signal based on the division ratio to generate a division data clock signal, selecting a first phase from among a plurality of phases based on the first phase control information, and generating a first comparison target clock signal (that is shifted from the division data clock signal by the first phase), comparing a phase of the first comparison target clock signal with a phase of the main clock signal, and transmitting a first phase comparison result to the memory controller.

According to another aspect of the inventive concept, there is provided a method of operating a memory device. The method includes: receiving a main clock signal and a data clock signal for a memory operation from a memory controller, selecting any one of a plurality of candidate division ratios according to a frequency ratio of the main clock signal to the data clock signal as a division ratio, generating division ratio information indicating the division ratio, transmitting the division ratio information to the memory controller, receiving phase control information from the memory controller, and then performing first training using a comparison target clock signal that is generated from the data clock signal (based on the division ratio and the phase control information). The phase control information is generated based on the division ratio information.

According to another aspect of the inventive concept, there is provided a method of operating a memory device configured to perform first training including a plurality of loop operations to align a first main clock signal and a data clock signal, which are received from a memory controller. The method includes setting a division ratio based on a frequency ratio of the first main clock signal to the data clock signal. An N-th loop operation of the loop operations (here, N is a positive integer) includes selecting an N-th phase from among a plurality of phases between which a unit interval is set according to the division ratio. An N-th comparison target clock signal is then generated from the data clock signal, based on the division ratio and the selected phase. A phase of the N-th comparison target clock signal is then compared with a phase of the first main clock signal and an N-th phase comparison result is generated.

According to further embodiments of the invention, methods of operating integrated circuit memory systems are provided. These memory systems include a memory controller and a memory, which receives a main clock signal and a data clock signal from the memory controller. According to these embodiments of the invention, operations are performed to transfer division ratio information, which is based on a frequency ratio of the main clock signal to the data clock signal from the memory to the memory controller. This divisional ratio information may be transferred in response to receiving mode register set data from the memory controller.

In response to the division ratio information, first phase control information is transferred from the memory controller to the memory. A division data clocks signal is then generated (within the memory) in response to dividing the data clock signal based on the frequency ratio. Next, a first comparison target clock signal is generated by shifting a phase of the division data clock signal based on the first phase control information, and then an operation is performed to compare a phase of the first comparison target clock signal to a phase of the main clock signal, to thereby generate a first phase comparison result. These comparison operations may then be followed by an option to transfer the first phase comparison result from the memory to the memory controller.

These operations may then be repeated. For example, operations may be performed to transfer, in response to the first phase comparison result, second phase control information from the memory controller to the memory. A second comparison target clock signal may then be generated by shifting a phase of the division data clock signal based on the second phase control information. Next, another comparison operation may be performed. This comparison operation may include comparing a phase of the second comparison target clock signal with a phase of the main clock signal to thereby generate a second phase comparison result. This second phase comparison result may be transferred from the memory to the memory controller.

According to additional embodiments of the invention, an integrated circuit memory device is provided having a control circuit therein. This control circuit is configured to divide a data clock signal received at an input thereof by a non-unity frequency ratio and then shift a phase of the divided data clock signal (e.g., in response to first phase control information received by the memory device), to thereby yield a first comparison target clock signal having a frequency equivalent to a frequency of a main clock signal received by the memory device. The control circuit is also configured to generate a first phase comparison result by comparing a phase of the first comparison target clock signal to a phase of the main clock signal.

In some of these embodiments of the invention, the first phase comparison result is transferred from the memory to a memory controller, which then generates second phase control information. Based on these operations, the control circuit may shift a phase of the divided data clock signal in response to second phase control information received by the memory device, to thereby yield a second comparison target clock signal having a frequency equivalent to the frequency of the main clock signal.

BRIEF DESCRIPTION OF THE DRAWINGS

Embodiments of the inventive concept will be more clearly understood from the following detailed description taken in conjunction with the accompanying drawings in which:

FIGS. 8A and 8B are diagrams for explaining phase control information generated by a phase control information generator of FIG. 2;

DETAILED DESCRIPTION OF THE EMBODIMENTS

Figure 1:
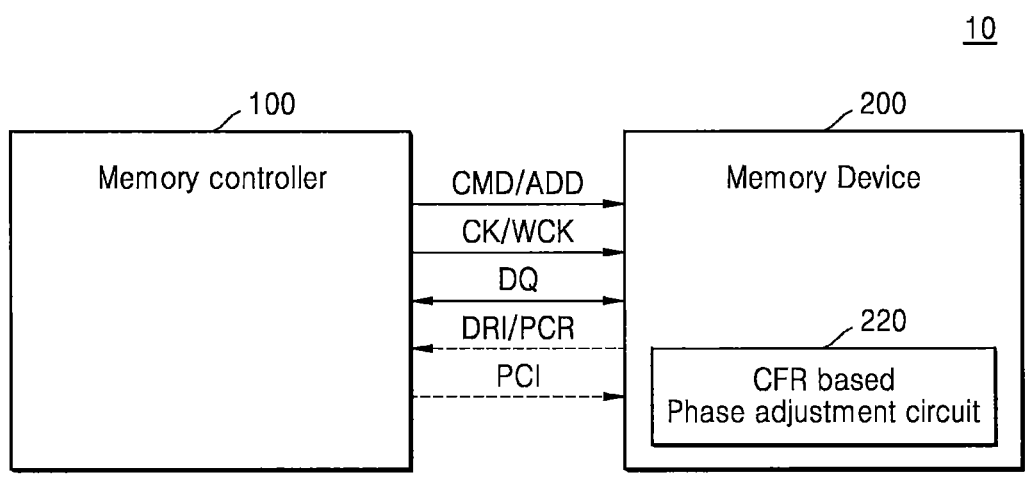
FIG. 1 is a block diagram of a memory system according to an embodiment.

FIG. 1 is a block diagram of a memory system 10 according to an embodiment.

Referring to FIG. 1, the memory system 10 may include a memory controller 100 and a memory device 200. The memory controller 100 may transmit various signals (e.g., a command CMD and an address ADD) for controlling the memory device 200 to the memory device 200. The memory controller 100 may transmit and receive data DQ to and from the memory device 200. The memory device 200 may store the data DQ in a memory cell array or transmit the data DQ stored in the memory cell array to the memory controller 100 in response to signals received from the memory controller 100.

The memory controller 100 may generate a main clock signal CK and a data clock signal WCK and transmit the main clock signal CK and the data clock signal WCK to the memory device 200. The main clock signal CK may be a clock signal used for the memory device 200 to perform predetermined memory operations (e.g., read/write operations), while the data clock signal WCK may be a clock signal used for the memory controller 100 to transmit and receive data DQ to and from the memory device 200. A frequency of the main clock signal CK may be different from a frequency of the data clock signal WCK. Further, the frequency of the data clock signal WCK may be higher than the frequency of the main clock signal CK. In an embodiment, a frequency ratio of the main clock signal CK to the data clock signal WCK may have one of various values, such as '1:2,' '1:4,' and '1:8.' The frequency ratio of the main clock signal CK to the data clock signal WCK may depend on the performance, operating environments, and type of the memory controller 100.

The memory device 200 may include a clock-to-clock frequency-based phase adjustment circuit (hereinafter, a phase adjustment circuit) 220. When coarse training for alignment between the main clock signal CK and the data clock signal WCK is performed, the phase adjustment circuit 220 may perform an operation of generating a comparison target clock signal based on the data clock signal WCK. In an embodiment, the phase adjustment circuit 220 may set a division ratio for the data clock signal WCK based on a frequency ratio of the main clock signal CK to the data clock signal WCK, and generate division ratio information DRI indicating the division ratio. Also, the phase adjustment circuit 220 may set any one of a plurality of candidate division ratios based on the frequency ratio of the main clock signal CK to the data clock signal WCK as a division ratio. Furthermore, the phase adjustment circuit 220 may select any one of a plurality of candidate division ratios as a division ratio based on an operation frequency area of the memory device 200, as described in detail below with reference to FIGS. 17 and 18A to 18C.

The memory device 200 may transmit the division ratio information DRI to the memory controller 100. The memory controller 100 may generate phase control information PCI based on the division ratio information DRI and transmit the phase control information PCI to the memory device 200. That is, the memory controller 100 may determine a shift phase of a division data clock signal during coarse training with reference to the division ratio information DRI, and transmit phase control information PCI indicating the determined shift phase to the memory device 200.

The phase adjustment circuit 220 may divide the data clock signal WCK based on the division ratio to generate the division data clock signal, and shift the phase of the division data clock signal based on the phase control information PCI to generate the comparison target clock signal. The phase adjustment circuit 220 may compare a phase of the comparison target clock signal with a phase of the main clock signal CK and generate a phase comparison result PCR. The memory device 200 may transmit the phase comparison result PCR to the memory controller 100, and the memory controller 100 may generate phase control information PCI required for generating the next comparison target clock signal based on the phase comparison result PCR, and transmit the phase control information PCI to the memory device 200. In the above-described manner, the memory device 200 may perform coarse training by using the phase adjustment circuit 220. However, the present embodiment is only an example embodiment, and the inventive concept is not limited thereto. In another embodiment, the memory device 200 may independently perform coarse training as will be described in detail below with reference to FIGS. 15 and 16.

As a result of coarse training, a comparison target clock signal having a phase closest to a phase of a main clock signal CK may be determined as a fixed comparison target clock signal, and the memory device 200 may perform fine training by using the fixed comparison target clock signal under the control of the memory controller 100. During the fine training, the memory controller 100 may transmit a main clock signal CK, which is shifted by a predetermined phase, to the memory device 200, and the phase adjustment circuit 220 may compare a phase of the fixed comparison target clock signal with a phase of the main clock signal CK, which is shifted by a predetermined phase, and generate a phase comparison result PCR.

As described above, the memory device 200 according to the present embodiment may transmit division ratio information DRI indicating a division ratio, which is based on a frequency ratio of a main clock signal CK to a data clock signal WCK, to the memory controller 100, and the memory controller 100 may transmit phase control information PCI corresponding to the division ratio to the memory device 200, so that efficient training may be performed based on the frequency ratio of the main clock signal CK to the data clock signal WCK.

Furthermore, since the memory device 200 sets the division ratio based on an operation frequency of the memory device 200, training based on the operation frequency may be optimally performed in terms of power consumption and a training margin.

Figure 2:
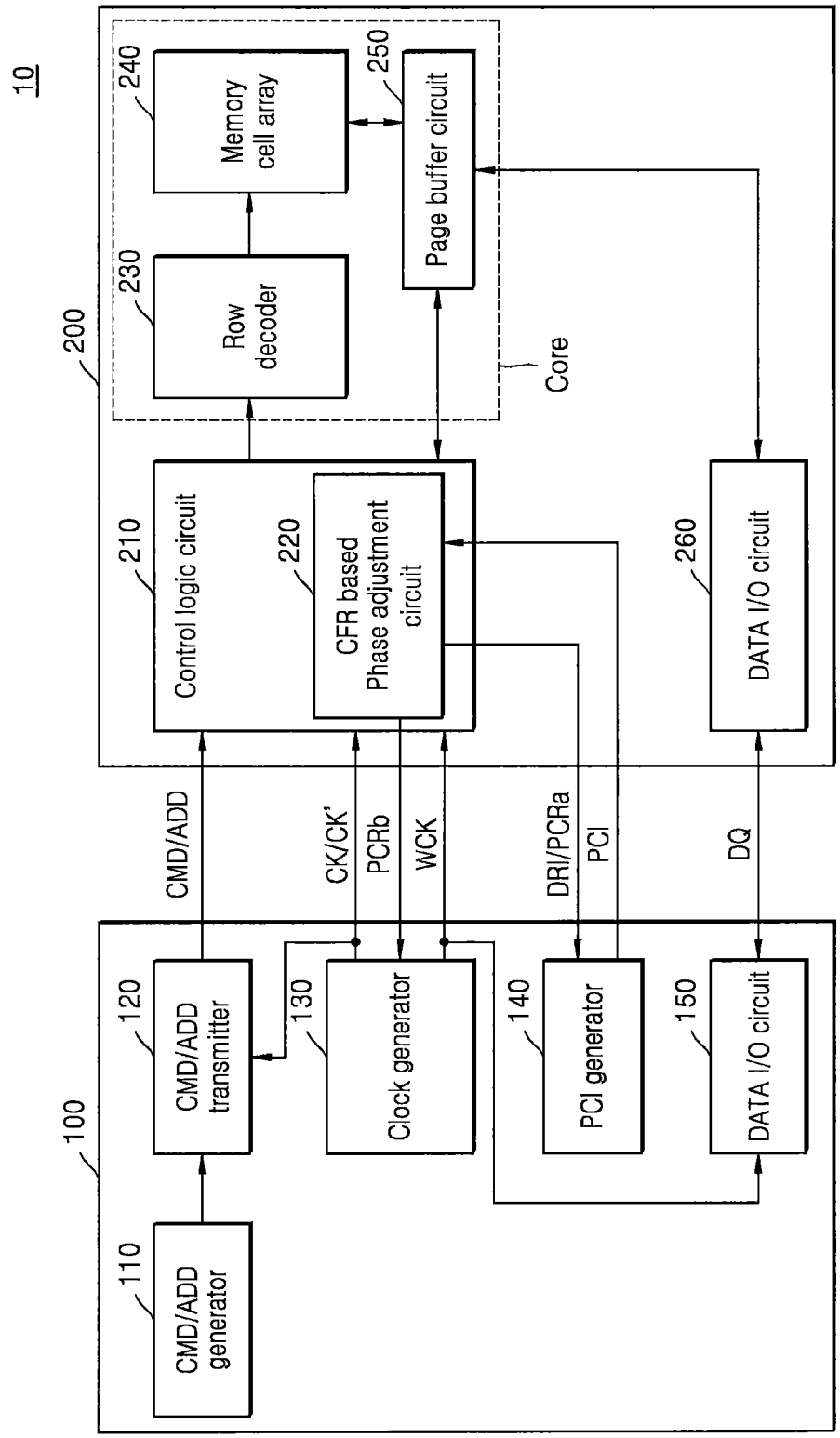
FIG. 2 is a block diagram of a memory system according to an embodiment in detail.

FIG. 2 is a block diagram of a memory system 10 according to an embodiment in detail.

Referring to FIG. 2, the memory system 10 may include a memory controller 100 and a memory device 200. The memory controller 100 may include a command/address generator 110, a command/address transmitter (hereinafter, CMD/ADD transmitter) 120, a clock generator 130, a phase control information generator (hereinafter, PCI generator) 140, and a data input/output (I/O) circuit 150. The clock generator 130 may include an oscillator (not shown), a phase-locked loop (PLL) circuit (not shown), or a delay-locked loop (DLL) circuit (not shown). The clock generator 130 may generate a main clock signal CK and a data clock signal WCK and transmit the main clock signal CK and the data clock signal WCK to the memory device 200. A frequency of the data clock signal WCK may be higher than a frequency of the main clock signal CK, and a frequency ratio of the main clock signal CK to the data clock signal WCK may have a predetermined set value.

The CMD/ADD transmitter 120 may receive commands/addresses CMD/ADD from the command/address generator 110, and transmit the commands/addresses CMD/ADD to the memory device 200 in synchronization with the main clock signal CK. The data I/O circuit 150 may transmit and receive data DQ in synchronization with the data clock signal WCK.

The memory device 200 may include a control logic circuit 210, a memory core Core, and a data I/O circuit 260. The memory core may include a row decoder 230, a memory cell array 240, and a page buffer circuit 250, and perform a memory operation in synchronization with a main clock signal CK. The control logic circuit 210 may include a phase adjustment circuit 220, and the phase adjustment circuit 220 may perform coarse training based on a frequency ratio of the main clock signal CK to a data clock signal WCK.

In an embodiment, the phase adjustment circuit 220 may set a division ratio based on a frequency ratio of the main clock signal CK to the data clock signal WCK to perform coarse training, generate division ratio information DRI indicating the division ratio, and transmit the division ratio information DRI to the PCI generator 140. The PCI generator 140 may generate phase control information PCI based on the division ratio information DRI, and transmit the phase control information PCI to the phase adjustment circuit 220. The phase adjustment circuit 220 may set a plurality of phases (or shift phases) with a predetermined unit interval therebetween based on the division ratio, and select any one of the phases based on the phase control information PCI. The phase adjustment circuit 220 may divide the data clock signal WCK based on a division ratio to generate a division data clock signal, shift the generated division data clock signal by a selected phase, and generate a comparison target clock signal. The phase adjustment circuit 220 may compare a phase of a comparison target clock signal with a phase of the main clock signal CK, generate a phase comparison result PCRa, and transmit the phase comparison result PCRa to the PCI generator 140. The PCI generator 140 may generate phase control information PCI required for generating the next comparison target clock signal based on the phase comparison result PCRa, and provide the phase control information PCI to the phase adjustment circuit 220. Thus, the phase adjustment circuit 220 may perform coarse training including a plurality of numbers of loop operations by using the phase control information PCI received from the PCI generator 140 as will be described in detail below with reference to FIGS. 3 and 4.

As a result of performing coarse training, a comparison target clock signal having a phase closest to a phase of the main clock signal CK, from among a plurality of comparison target clock signals, may be determined as a fixed comparison target clock signal. In this case, the memory controller 100 may control the phase adjustment circuit 220 to continuously generate the fixed comparison target clock signal. In an embodiment, the PCI generator 140 may transmit phase control information PCI to the phase adjustment circuit 220 so that the phase adjustment circuit 220 may generate the fixed comparison target clock signal. Thereafter, the clock generator 130 may transmit a main clock signal CK,' which is shifted by a predetermined unit interval, to the phase adjustment circuit 220. The phase adjustment circuit 220 may compare a phase of the shifted main clock signal CK' with a phase of the fixed comparison target clock signal, generate a phase comparison result PCRb, and generate the phase comparison result PCRb to the clock generator 130. The clock generator 130 may adjust a phase of the main clock signal CK based on the phase comparison result PCRb and provide a phase-adjusted main clock signal CK' to the phase adjustment circuit 220. In the above-described manner, the phase adjustment circuit 220 may perform fine training. As a result, a phase of the main clock signal CK' may be aligned with a phase of the fixed comparison target clock signal.

The control logic circuit 210 may control the memory operation of the memory core Core in synchronization with the main clock signal CK' of which the phase is aligned with the phase of the fixed comparison target clock signal, in response to the received commands/addresses CMD/ADD. Also, the data I/O circuit 260 may transmit and receive data required for the memory operation in synchronization with the fixed comparison target clock signal of which the phase is aligned with the phase of the main clock signal CK.'

Figure 3:
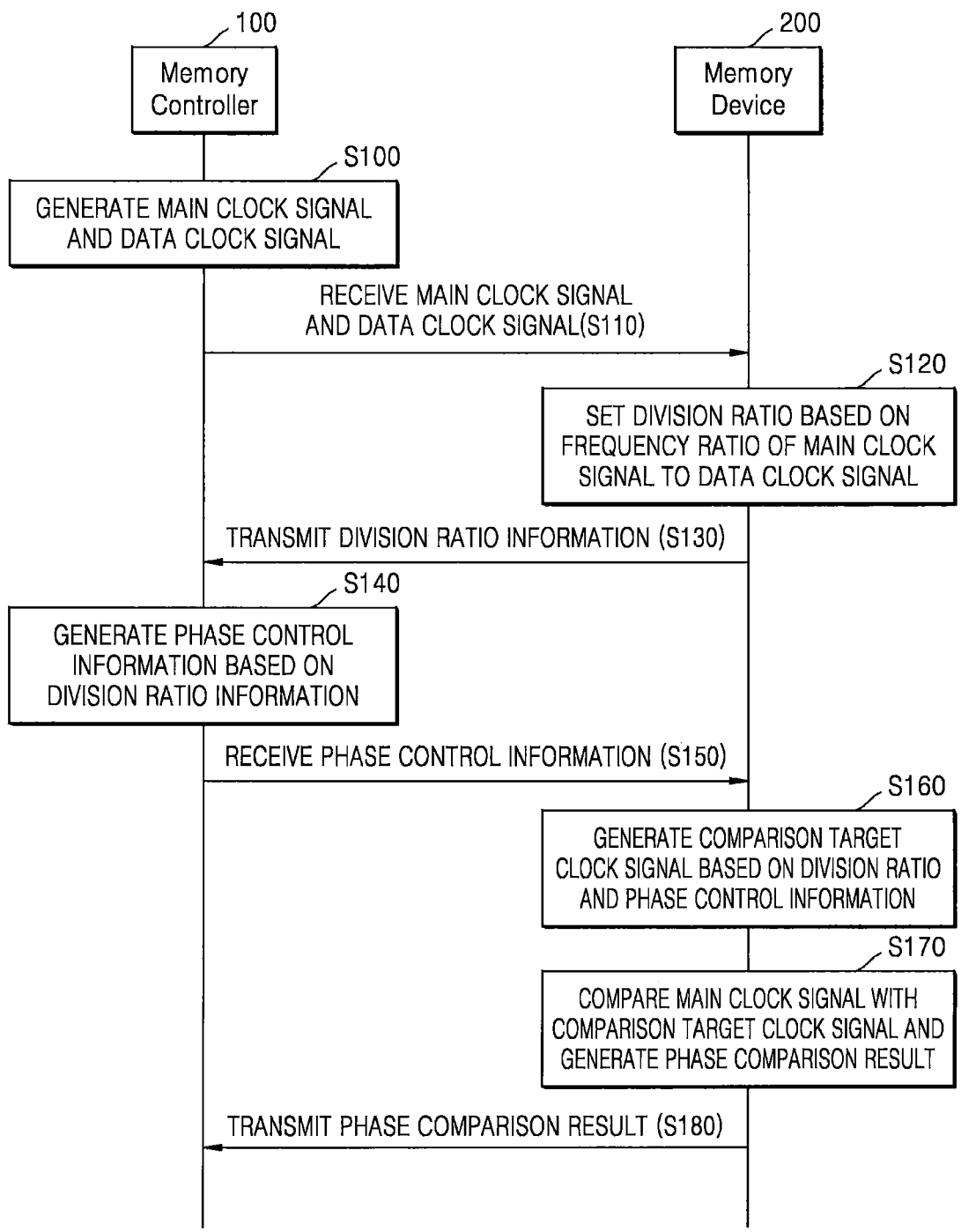
FIG. 3 is a flowchart for explaining coarse training according to an embodiment.

FIG. 3 is a flowchart for explaining coarse training according to an embodiment.

Referring to FIG. 3, a memory controller 100 may generate a main clock signal and a data clock signal (S100). The memory device 200 may receive the main clock signal and the data clock signal from the memory controller 100 (S110). The memory device 200 may set a division ratio for a data clock signal based on a frequency ratio of a main clock signal to a data clock signal (S120). The memory device 200 may select any one of a plurality of candidate division ratios based on the frequency ratio of the main clock signal to the data clock signal and set the selected candidate division ratio as the division ratio. The memory device 200 may transmit division ratio information indicating the division ratio to the memory controller 100 (S130). The memory controller 100 may generate phase control information based on the division ratio information (S140). The memory device 200 may receive the phase control information from the memory controller 100 (S150). The memory device 200 may generate a comparison target clock signal based on the division ratio and the phase control information (S160). That is, the memory device 200 may divide the data clock signal based on the division ratio, generate a division data clock signal, select any one of a plurality of phases based on the phase control information, and generate a division data clock signal, which is shifted by the selected phase. Detailed descriptions of the division ratio information will be described below with reference to FIGS. 7A and 7B, and detailed descriptions of the phase control information will be described below with reference to FIGS. 8A and 8B.

Figure 4:
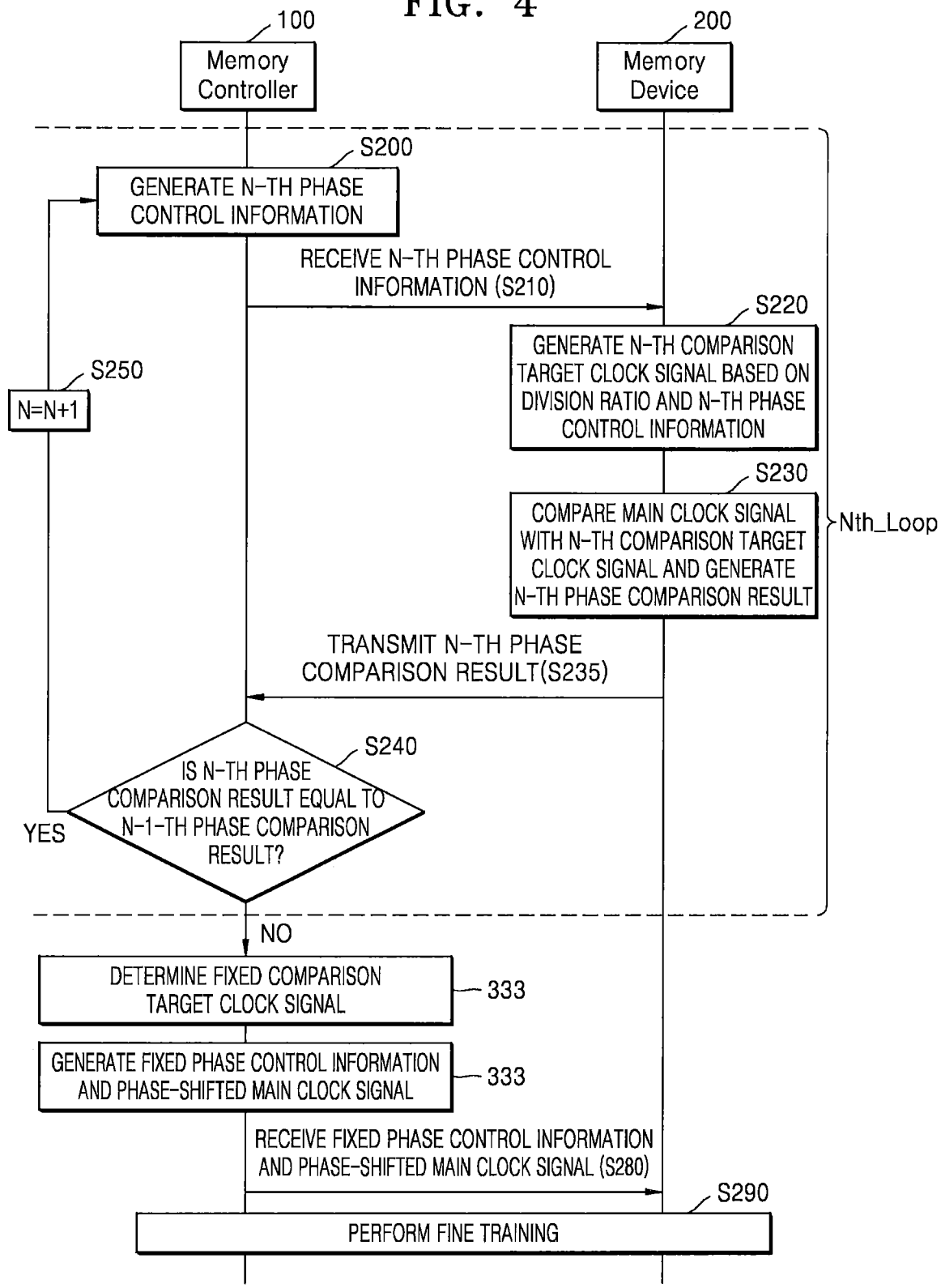
FIG. 4 is a flowchart for explaining a loop operation included in coarse training according to an embodiment.

FIG. 4 is a flowchart for explaining a loop operation included in coarse training according to an embodiment.

Referring to FIG. 4, a memory device 200 may perform coarse training including a plurality of loop operations along with a memory controller 100. Hereinafter, an arbitrary N-th loop operation Nth_Loop of the plurality of loop operations will be described. The memory controller 100 may generate an N-th phase control information (S200). The memory device 200 may receive N-th phase control information from the memory controller 100 (S210). The memory device 200 may generate an N-th comparison target clock signal based on a division ratio and N-th phase control information (S230). The memory device 200 may compare a main clock signal with the N-th comparison target clock signal and generate an N-th phase comparison result (S230). The memory device 200 may transmit the N-th phase comparison result to the memory controller 100 (S235).

The memory controller 100 may determine whether an N-th phase detection signal is equal to an N−1-th phase comparison result generated by an N−1-th loop operation performed before the N-th loop operation Nth_Loop (S240). When the N-th phase comparison result is equal to the N−1-th phase comparison result (refer to YES of S240), the memory controller 100 may count up 1 to N (S250), generate the next phase control information, for example, N+1-th phase control information, and perform the next loop operation, for example, an N+1-th loop operation. When the N-th phase comparison result is different from the N−1-th phase comparison result (refer to NO of S240), the memory controller 100 may determine any one of the N-th comparison target clock signal and the N−1-th comparison target clock signal of the N−1-th loop operation as a fixed comparison target clock signal (S260), thereby completing coarse training. The memory controller 100 may generate fixed phase control information and a main clock signal that is shifted by a predetermined phase (S270). The memory device 200 may receive the fixed phase control information and the phase-shifted main clock signal (S280). The memory device 200 may generate a fixed comparison target clock signal based on the fixed phase control information, and perform fine training by using the phase-shifted main clock signal and the fixed comparison target clock signal (S290).

Figure 5:
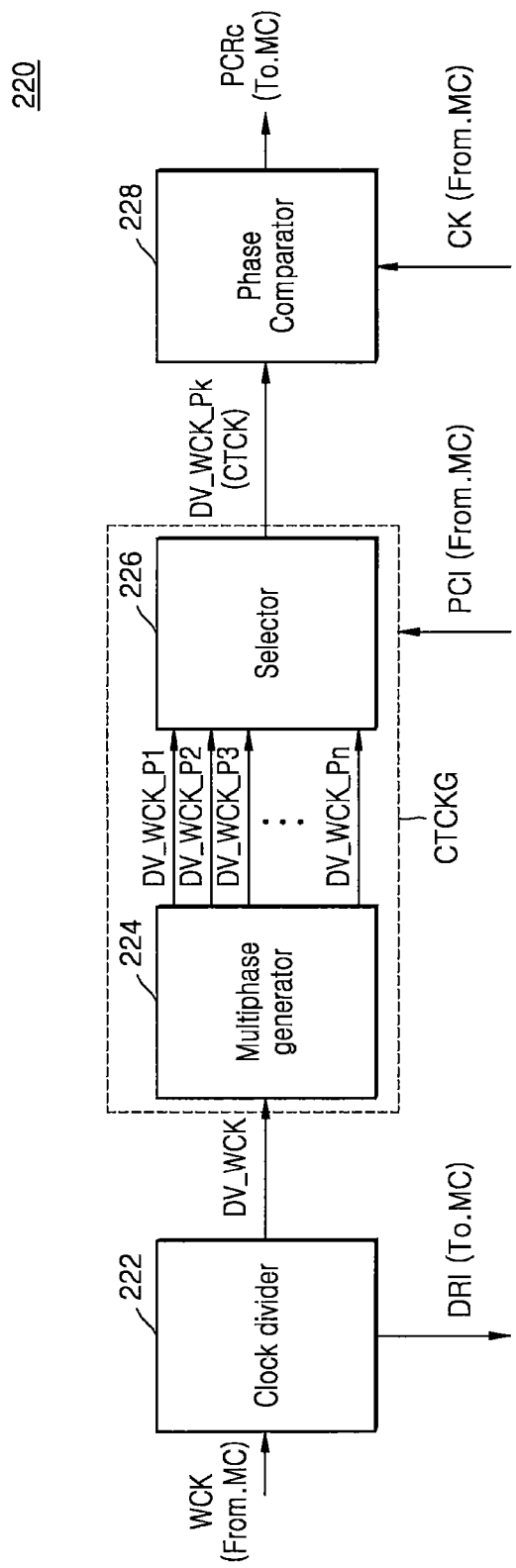
FIG. 5 is a block diagram of a phase adjustment circuit according to an embodiment.
Figure 6A:
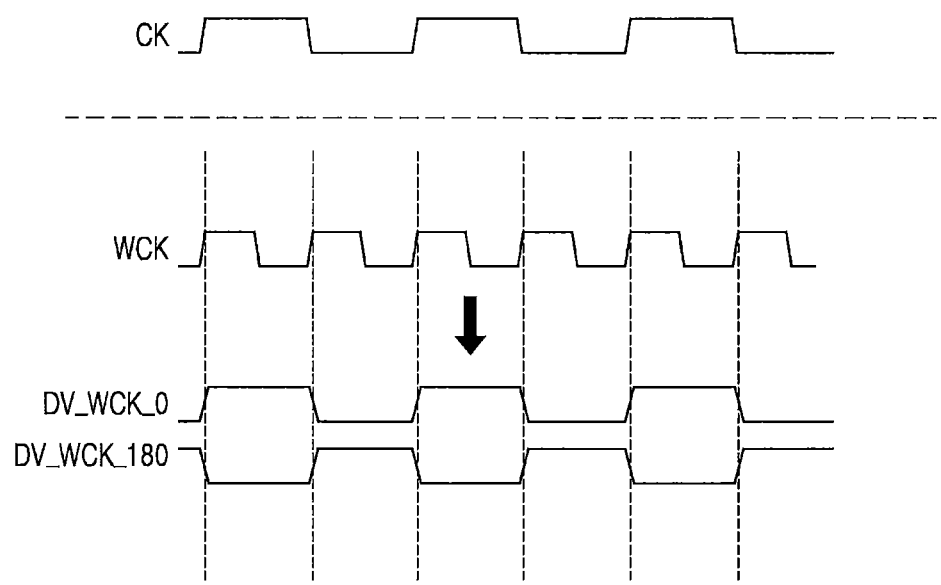
FIGS. 6A to 6C are waveform diagrams of shifted division signals for explaining operations of a comparison target clock generating unit of FIG. 5.
Figure 6B:
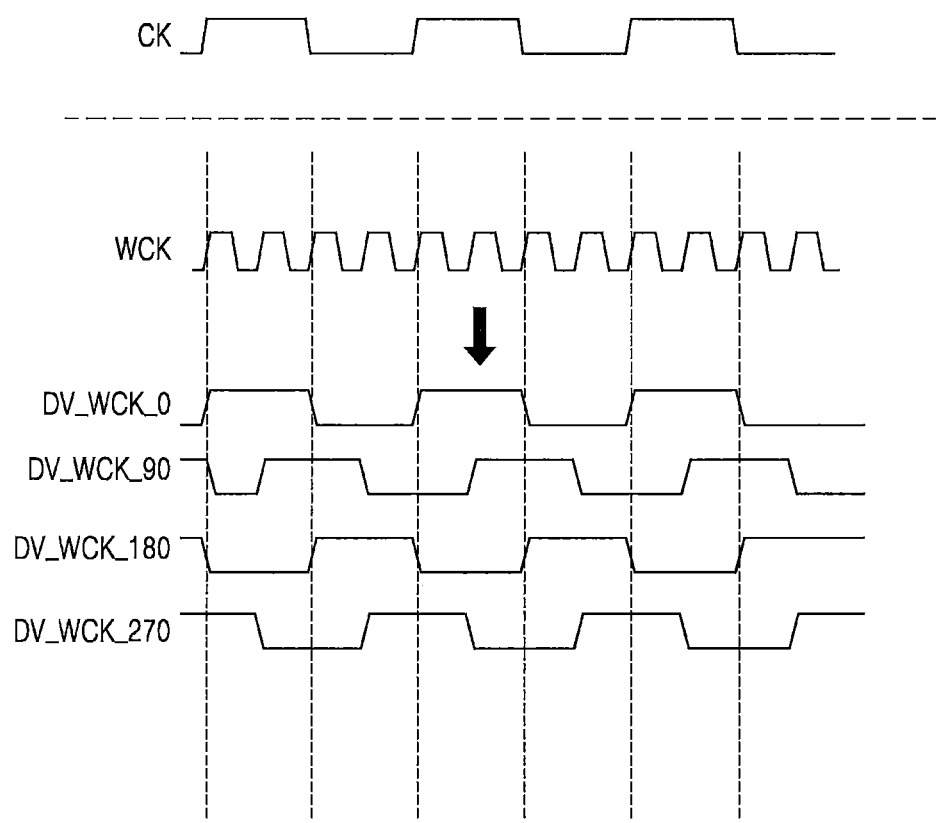
Figure 6C:
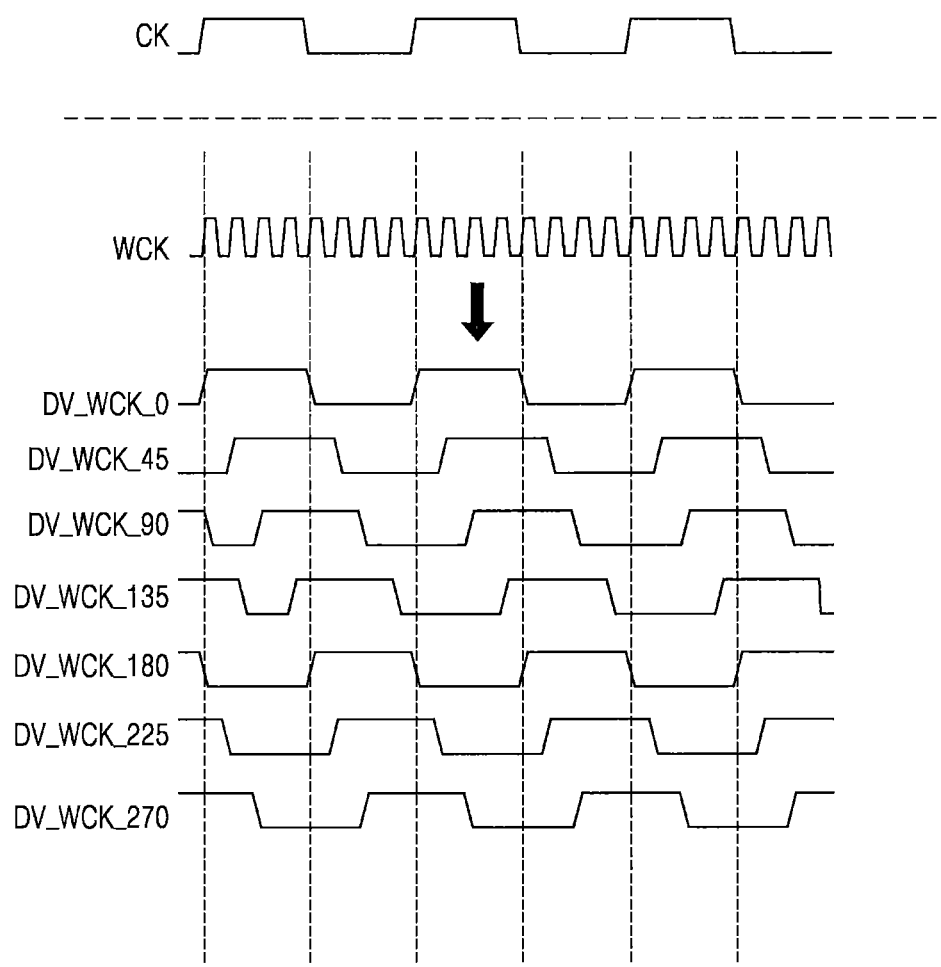

FIG. 5 is a block diagram of a phase adjustment circuit 220 according to an embodiment. FIGS. 6A to 6C are waveform diagrams of shifted division clock signals for explaining operations of a comparison target clock generating unit CTCKG of FIG. 5.

Referring to FIG. 5, the phase adjustment circuit 220 may include a clock divider 222, a comparison target clock generating unit CTCKG, and a phase comparator 228 (or a phase detector). In an embodiment, the clock divider 222 may receive a data clock signal WCK from a memory controller MC and set a division ratio based on a frequency ratio of a main clock signal CK to the data clock signal WCK. The clock divider 222 may divide the data clock signal WCK based on the division ratio, generate a division data clock signal DV_WCK, and provide division data DV_WCK to the comparison target clock generating unit CTCKG. Also, the clock divider 222 may generate division ratio information DRI and transmit the division ratio information DRI to the memory controller MC. In an embodiment, the division ratio information DRI may be bit data and have a bit value indicating a set division ratio.

The comparison target clock generating unit CTCKG may include a multiphase generator 224 and a selector 226. The multiphase generator 224 may generate division data clock signals DV_WCK_P1 to DV_WCK_Pn, which are shifted from the division data clock signal DV_WCK by respective phases between which a unit interval is set based on the division ratio, and provide the shifted division data clock signals DV_WCK_P1 to DV_WCK_Pn to the selector 226. In an example, referring further to FIG. 6A, when the frequency ratio of the main clock signal CK to the data clock signal WCK is '1:2,' the clock divider 222 may set the division ratio for the data clock signal WCK as '1:2,' and the multiphase generator 224 may set a unit interval of '180°' and generate division data clock signals DVWCK_0 and DV_WCK_180, which are shifted by '0°' and '180°,' respectively. In another example, referring further to FIG. 6B, when the frequency ratio of the main clock signal CK to the data clock signal WCK is '1:4,' the clock divider 222 may set the division ratio for the data clock signal WCK as '1:4,' and the multiphase generator 224 may set a unit interval of '90°' and generate division data clock signals DV_WCK_0 to DV_WCK_270, which are shifted by '0°,' '90°,' '180°,' and '270°,' respectively. In yet another example, referring further to FIG. 6C, when the frequency ratio of the main clock signal CK to the data clock signal WCK is '1:8,' the clock divider 222 may set the division ratio for the data clock signal WCK as '1:8,' and the multiphase generator 224 may set a unit interval of '45°' and generate division data clock signals DV_WCK_0 to DV_WCK_315, which are shifted by '0°,' '45°,' '90°,' '135°,' '180°,' '225°,' '270°,' and '315°.' In another embodiment, the clock divider 222 may select any one of a plurality of candidate division ratios based on the frequency ratio of the main clock signal CK to the data clock signal WCK and set the selected candidate division ratio as the division ratio as will be described below with reference to FIGS. 17, 18A to 18C, 19A, and 19B.

The selector 226 may select any one signal DV_WCK_Pk of the plurality of shifted division data clock signals DV_WCK_P1 to DV_WCK_Pn based on the phase control information PCI received from the memory controller MC as a comparison target clock signal CTCK and provide the selected signal DV_WCK_Pk to the phase comparator 228. In an example, the selector 226 may sequentially select the shifted division data clock signals DV_WCK_P1 to DV_WCK_Pn based on the bit value of the phase control information PCI. However, since configuration of the comparison target clock generating unit CTCKG of FIG. 5 is only an example embodiment, the inventive concept is not limited thereto. The comparison target clock generating unit CTCKG may include only the multiphase generator 224, and the multiphase generator 224 may generate one shifted division data clock signal DV_WCK_Pk based on the phase control information PCI.

The phase comparator 228 may compare a phase of the main clock signal CK received from the memory controller MC with a phase of the comparison target clock signal CTCK, generate a phase comparison result PCRa, and generate the phase comparison result PCRa to the memory controller MC. The memory controller MC may generate the next phase control information PCI based on at least one of the phase comparison result PCRa and the division ratio information DRI and provide the generated phase control information PCI to the comparison target clock generating unit CTCKG.

Figures 7A, 7B:
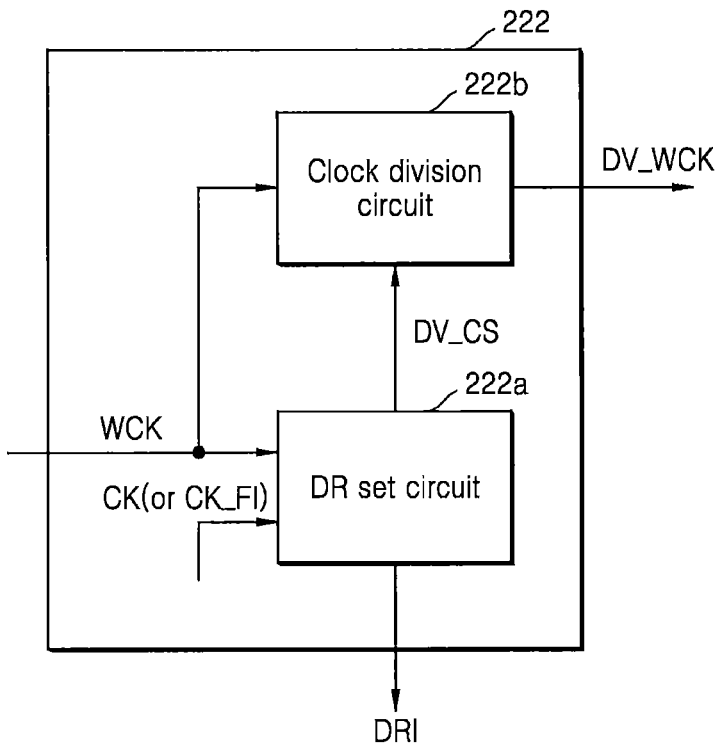
FIG. 7A is a block diagram of a clock divider of FIG. 5.
FIG. 7B is a diagram for explaining division ratio information generated by the clock divider of FIG. 7A.

FIG. 7A is a block diagram of the clock divider 222 of FIG. 5, and FIG. 7B is a specific diagram for explaining division ratio information DRI generated by the clock divider 222 of FIG. 7A.

Referring to FIG. 7A, the clock divider 222 may include a division ratio set circuit (hereinafter, a DR set circuit) 222a and a clock division circuit 222b. The DR set circuit 222a may receive a data clock signal WCK and a main clock signal CK, calculate a frequency ratio of the data clock signal WCK to the main clock signal CK, and set a division ratio. In an embodiment, the DR set circuit 222a may count rising edges of each of the data clock signal WCK and the main clock signal CK in a predetermined amount of time, calculate a frequency ratio, and set a division ratio. In another embodiment, the DR set circuit 222a may receive main clock frequency information CK FI and calculate a frequency ratio by using the main clock frequency information CK FI.

The DR set circuit 222a may generate division ratio information DRI indicating a set division ratio. Referring further to FIG. 7B, a first table TB1 may indicate a relationship between division ratio information DRI and a division ratio DR, and the division ratio information DRI may be bit data indicating the division ratio DR. For example, when the division ratio DR is 1:2, the DR set circuit 222a may generate division ratio information DRI of '$V_1$.' In an embodiment, a bit number of the division ratio information DRI may be set according to a supportable division ratio range DR range of the clock divider 222. In other words, when the clock divider 222 is capable of dividing the data clock signal WCK into various division ratios, since the supportable division ratio range DR range of the clock divider 222 is wide, the bit number of the division ratio information DRI may be set to a great bit number. For example, division ratio information DRI generated by the clock divider 222 capable of supporting division ratios DR of '1:2' and '1:4' may be set to one bit, and division ratio information DRI generated by the clock divider 222 capable of supporting division ratios DR of '1:2,' '1:4,' '1:8,' and '1:16' may be set to two bits.

The DR set circuit 222a may generate a division control signal DV_CS based on the set division ratio and provide the division control signal DV_CS to the clock division circuit 222b. The clock division circuit 222b may divide the data clock signal WCK according to the division ratio in response to the division control signal DV_CS and generate a division data clock signal DV_WCK.

FIGS. 8A and 8B are diagrams for explaining phase control information PCI generated by the PCI generator 140 of FIG. 2.

Referring to FIG. 8A, a second table TB2 may indicate phase control information PCI that may be generated by the PCI generator 140 based on a division ratio DR. When the division ratio DR is '1:2,' shift phases SP for a division data clock signal may be '0°' and '180°,' and the phase control information PCI may be set to one bit. The PCI generator 140 may generate phase control information PCI of a value '$V_{11}(0)$' so that the phase adjustment circuit 220 may shift the division data clock signal by '0°,' and provide the phase control information PCI of the value '$V_{11}(0)$' to the phase adjustment circuit 220. The PCI generator 140 may generate phase control information PCI of the value '$V_{12}(1)$' so that the phase adjustment circuit 220 may shift the division data clock signal by '180°,' and the phase control information PCI of the value '$V_{12}(1)$' to the phase adjustment circuit 220.

When the division ratio DR is '1:4,' shift phases SP for the division data clock signal may be '0°,' '90°,' '180°,' and '270°,' and the phase control information PCI may be set to two bits. The PCI generator 140 may generate phase control information PCI of a value '$V_{21}(00)$' so that the phase adjustment circuit 220 may shift the division data clock signal by '0°,' and provide the phase control information PCI of the value '$V_{21}(00)$' to the phase adjustment circuit 220. The PCI generator 140 may generate phase control information PCI of a value '$V_{22}(01)$' so that the phase adjustment circuit 220 may shift the division data clock signal by '90°,' and provide the phase control information PCI of the value '$V_{22}(01)$' to the phase adjustment circuit 220. The PCI generator 140 may generate phase control information PCI of a value '$V_{23}(10)$' so that the phase adjustment circuit 220 may shift the division data clock signal by '180°,' and provide the phase control information PCI of the value '$V_{23}(10)$' to the phase adjustment circuit 220. Also, the PCI generator 140 may generate phase control information PCI of a value '$V_{24}(11)$' so that the phase adjustment circuit 220 may shift the division data clock signal by '270°,' and provide the phase control information PCI of the value '$V_{24}(11)$' to the phase adjustment circuit 220.

When the division ratio DR is '1:M,' shift phases SP for the division data clock signal may be 'P1° (0°)' to 'Pn°,' and the phase control information PCI may be set to r bits. As described above, the PCI generator 140 may generate phase control information PCI of which a bit number is differently set based on the division ratio DR, and provide the generated phase control information PCI to the phase adjustment circuit 220.

Unlike in FIG. 8A, FIG. 8B illustrates an embodiment in which the PCI generator 140 generates phase control information PCI of which a bit number is set to be constant regardless of the division ratio DR, and provide the generated phase control information PCI to the phase adjustment circuit 220. In an embodiment, a bit number of the phase control information PCI may be set according to a range of division ratios, which may be supported by the phase adjustment circuit 220. Referring to FIG. 8B, for example, the phase adjustment circuit 220 may support up to a division ratio DR of '1:8.' Thus, the bit number of the phase control information PCI may be set to three bits. A third table TB3 indicates phase control information PCI that may be generated by the PCI generator 140 based on the division ratio DR.

For example, in a first case Case1 in which the division ratio DR of the phase adjustment circuit 220 is '1:2,' the PCI generator 140 may generate phase control information PCI of a value '000' so that the phase adjustment circuit 220 may shift the division data clock signal by '0°,' and provide the phase control information PCI of the value '000' to the phase adjustment circuit 220. Also, the PCI generator 140 may generate phase control information PCI of a value '100' so that the phase adjustment circuit 220 may shift the division data clock signal by '180°,' and provide the phase control information PCI of the value '100' to the phase adjustment circuit 220. The descriptions of the first case may be applied to a second case Case2 and a third case Case3 and thus, detailed descriptions thereof will be omitted.

In the above-described manner, when the phase adjustment circuit 220 divides a data clock signal based on a specific division ratio, the PCI generator 140 may generate phase control information PCI having a bit number appropriate for the specific division ratio, and provide the generated phase control information PCI to the phase adjustment circuit 220.

Figure 9:
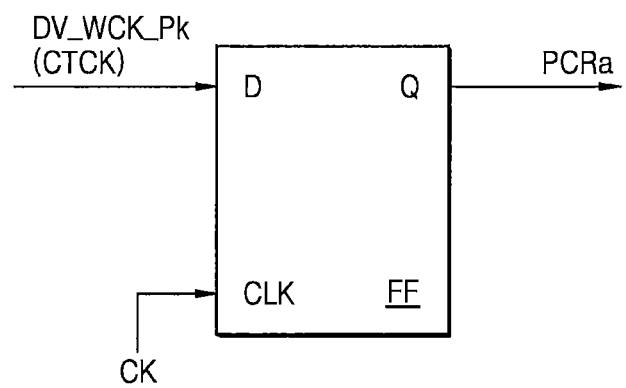
FIG. 9 is a diagram of a phase comparator of FIG. 5, according to an example embodiment.
Figure 10:
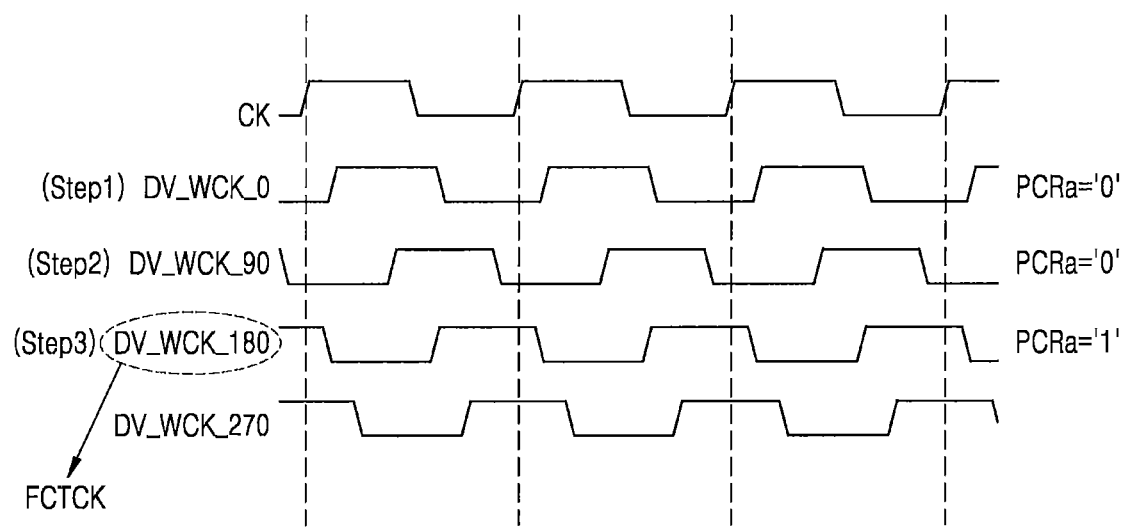
FIG. 10 is a waveform diagram of a method of determining a fixed comparison target clock signal by a phase adjustment circuit of FIG. 2.

FIG. 9 is a diagram of the phase comparator 228 of FIG. 5, according to an example embodiment, and FIG. 10 is a waveform diagram of a method of determining a fixed comparison target clock signal by the phase adjustment circuit 220 of FIG. 2. In FIG. 10, it is assumed that a division ratio set by the phase adjustment circuit 220 is '1:4.'

Referring to FIG. 9, the phase comparator 228 may include a flip-flop FF configured to latch a comparison target clock signal CTCK in response to a main clock signal CK, compare a phase of the main clock signal CK with a phase of the comparison target clock signal CTCK, and output a phase comparison result PCRa. In an embodiment, the phase comparison result PCRa may be a 1-bit signal indicating which one of the main clock signal CK and the comparison target clock signal CTCK has a phase that leads a phase of the other one thereof. For example, the phase comparison result PCRa may have a value '1' (or a high-level value) when a phase of the comparison target clock signal CTCK leads a phase of the main clock signal CK, and have a value '0' (or a low-level value) when the phase of the comparison target clock signal CTCK trails the phase of the main clock signal CK.

The operations of the phase adjustment circuit 220 will now be described in detail with reference to FIGS. 5 and 10. In a first step Step1, the comparison target clock generating unit CTCKG may select a phase of '0° ' based on phase control information PCI, from among a plurality of phases (0° to 270°) between which a unit interval (90°) is set based on a division ratio. The comparison target clock generating unit CTCKG may generate a division data clock signal DV_WCK_0, which is shifted from a division data clock signal DV_WCK by '0°,' as the comparison target clock signal CTCK and provide the shifted division data clock signal DV_WCK_0 to the phase comparator 228. In this case, since a phase of the division data clock signal DV_WCK_0 shifted by '0° ' trails a phase of the main clock signal CK, in the first step Step1, the phase comparator 228 may generate a phase comparison result PCRa of a value '0' and provide the phase comparison result PCRa to the memory controller MC.

The memory controller MC may receive the phase comparison result PCRa and provide phase control information PCI having a different value from the phase control information PCI in the first step Step1 to the comparison target clock generating unit CTCKG so that in a second step Step2, the comparison target clock generating unit CTCKG may select the next phase (90°) and select a comparison target clock signal CTCK. Although it is assumed in FIG. 10 that the memory controller MC generates phase control information PCI to select sequential phases having a unit interval therebetween and provides the phase control information PCI to the comparison target clock generating unit CTCKG, the present embodiment is only an example embodiment, and the inventive concept is not limited thereto. The memory controller MC may generate phase control information PCI so that the comparison target clock generating unit CTCKG may select phases in various orders.

In the second step Step2, the comparison target clock generating unit CTCKG may select a phase of '90° ' based on the phase control information PCI from among phases (0° to) 270°, generate a division data clock signal DV_WCK_90, which is shifted from a division data clock signal DV_WCK by '90°,' and provide the shifted division data clock signal DV_WCK_90 to the phase comparator 228. In this case, since a phase of the division data clock signal DV_WCK_90 shifted by '90°' trails a phase of the main clock signal CK, in the second step Step2, the phase comparator 228 may generate a phase comparison result PCRa of a value '0' and provide the phase comparison result PCRa to the memory controller MC.

The memory controller MC may compare the phase comparison result PCRa received in the second step Step2 with the phase comparison result PCRa received in the first step Step1 and determine whether to proceed to the next step based on the comparison result. In an example, since the phase comparison result PCRa of the second step Step2 is equal to the phase comparison result PCRa of the first step Step1, the memory controller MC may proceed to the third step Step3. In the third step Step3, the memory controller MC may provide phase control information PCI having a different value from the phase control information PCI of the second step Step2 to the comparison target clock generating unit CTCKG so that the comparison target clock generating unit CTCKG may select a phase of 180° and select a comparison target clock signal CTCK. In the third step Step3, the comparison target clock generating unit CTCKG may select a phase of '180°' based on the phase control information PCI from among the phases (0° to 270°), generate a division data clock signal DV_WCK_180, which is shifted from the division data clock signal DV_WCK by '180°,' and provide the shifted division data clock signal DV_WCK_180 to the phase comparator 228. In this case, since a phase of the division data clock signal DV_WCK_180 shifted by '180°' leads the phase of the main clock signal CK, in the third step Step3, the phase comparator 228 may generate a phase comparison result PCRa of a value '1' and provide the phase comparison result PCRa to the memory controller MC.

The memory controller MC may compare the phase comparison result PCRa received in the third step Step3 with the phase comparison result PCRa received in the second step Step2 and determine whether to proceed to the next step based on the comparison result. In an example, since the phase comparison result PCRa of the third step Step3 is different from the phase comparison result PCRa of the second step Step2, the memory controller MC may not proceed to a fourth step Step4 but decide to perform the next fine training. In an example, since the phase comparison result PCRa of the third step Step3 is different from the phase comparison result PCRa of the second step Step2, the memory controller MC may recognize, based on the comparison result, that a comparison target clock signal having a phase closest to the phase of the main clock signal CK is the division data clock signal DV_WCK_90 shifted by '90°' or the division data clock signal DV_WCK_180 shifted by '180°.' The memory controller MC may determine any one of the division data clock signal DV_WCK_90 shifted by '90°' or the division data clock signal DV_WCK_180 shifted by '180°' to be a fixed comparison target clock signal FCTCK and complete coarse training. FIG. 10 illustrates an example in which the division data clock signal DV_WCK_180 shifted by '180°' is determined to be the fixed comparison target clock signal FCTCK.

Figure 11:
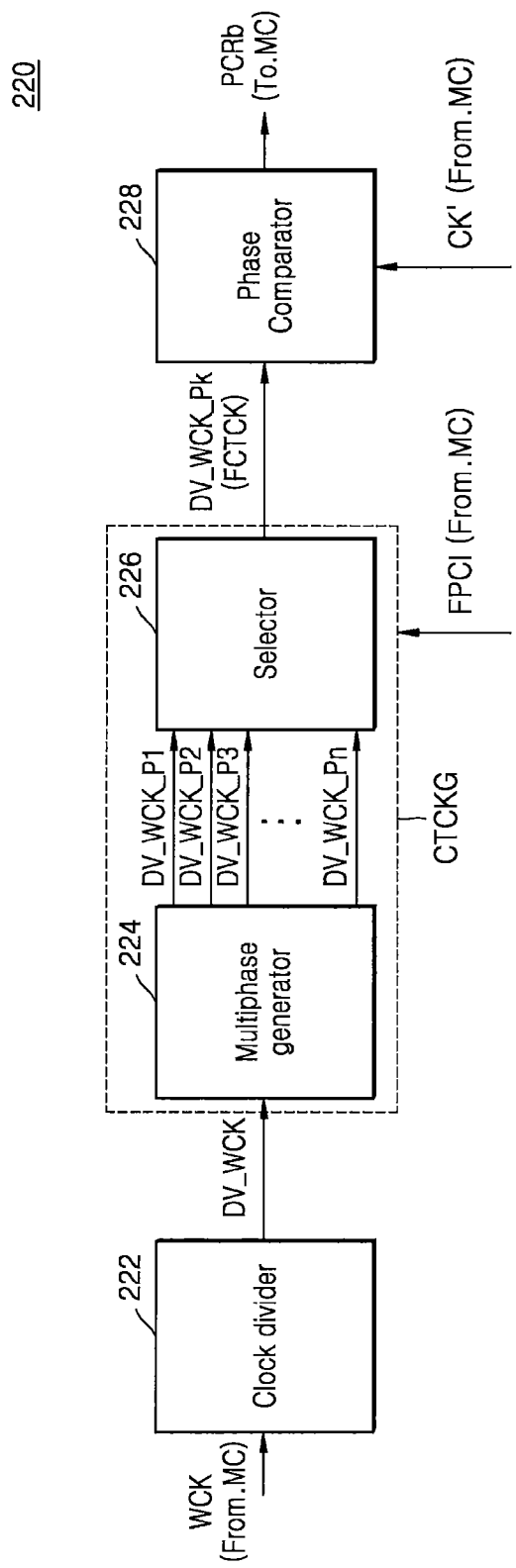
FIG. 11 is a diagram for a fine training operation of a phase adjustment circuit according to an embodiment.

FIG. 11 is a diagram for explaining a fine training operation of a phase adjustment circuit 220 according to an embodiment.

Referring to FIG. 11, the phase adjustment circuit 220 may include a clock divider 222, a comparison target clock generating unit CTCKG, and a phase comparator 228 (or a phase detector). Since configuration of the phase adjustment circuit 220 is the same as described with reference to FIG. 5, detailed descriptions thereof will be omitted.

As described above with reference to FIG. 10, a memory controller MC may determine a fixed comparison target clock signal FCTCK, and provide fixed phase control information FPCI to the comparison target clock generating unit CTCKG so that the comparison target clock generating unit CTCKG may generate the fixed comparison target clock signal FCTCK. The comparison target clock generating unit CTCKG may generate the fixed comparison target clock signal FCTCK required for fine training based on the fixed phase control information FPCI. In an example, as shown in FIG. 10, when the division data clock signal DV_WCK_180 that is shifted by '180°' is determined as the fixed comparison target clock signal FCTCK, the fixed phase control information FPCI may have a predetermined value so that the comparison target clock generating unit CTCKG may select a phase '180°' of a plurality of phases of 0° to 270°). The comparison target clock generating unit CTCKG may generate the division data clock signal DV_WCK_180 that is shifted by '180°' as the fixed comparison target clock signal FCTCK based on fixed phase control information FPCI and provide the generated division data clock signal DV_WCK_180 to the phase comparator 228.

The phase comparator 228 may receive a main clock signal CK,' which is shifted by a predetermined unit interval, from the memory controller MC, compare a phase of the main clock signal CK' with a phase of a fixed comparison target clock signal FCTCK, and generate a phase comparison result PCRb. The phase comparator 228 may provide the phase comparison result PCRb to the memory controller MC, and the memory controller MC may control a fine training operation on the phase adjustment circuit 220 based on the phase comparison result PCRb. As a result of fine training, the memory controller MC may detect a phase of the main clock signal CK,' which may be aligned with the phase of the fixed comparison target clock signal FCTCK.

Figure 12:
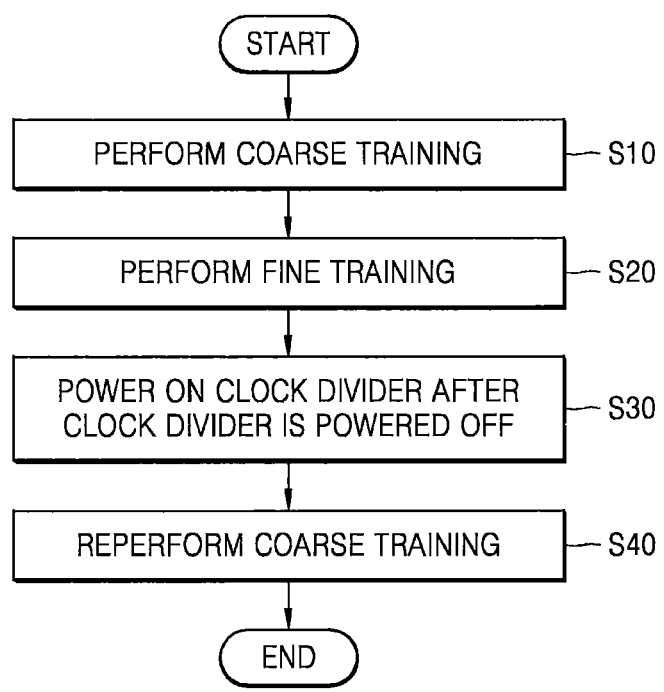
FIG. 12 is a flowchart of an operation to which an embodiment is applied.

FIG. 12 is a flowchart of an operation to which an embodiment is applied.

Referring to FIG. 12, training for alignment between a main clock signal and a data clock signal may be performed so that a memory device may perform a memory operation. The training may include coarse training and fine training. To begin, according to the embodiment described above with reference to FIGS. 1 to 11, the memory device may perform coarse training before fine training along with a memory controller (S10). Thereafter, for elaborate clock-to-clock alignment, the memory device may perform fine training along with the memory controller (S20), thereby completing a training operation. The memory device may perform the memory operation by using the aligned main clock signal and data clock signal. Subsequently, due to a specific operation, after a phase adjustment circuit of the memory device or a clock divider included in the phase adjustment is powered off, the phase adjustment circuit or the clock divider may be powered on again (S30). In an example, when the clock divider is powered on again after the clock divider is powered off, the clock divider may generate a division data clock signal having a different phase from the data clock signal, for example, a division data clock signal having an inverted phase. Thus, after the clock divider is powered on, the memory device may perform coarse training again (S40), so that a phase of the main clock signal may be aligned with a phase of the data clock signal. Meanwhile, since the training operation is already completed in operation S20, performing fine training after operation S40 may be unnecessary.

Figure 13A:
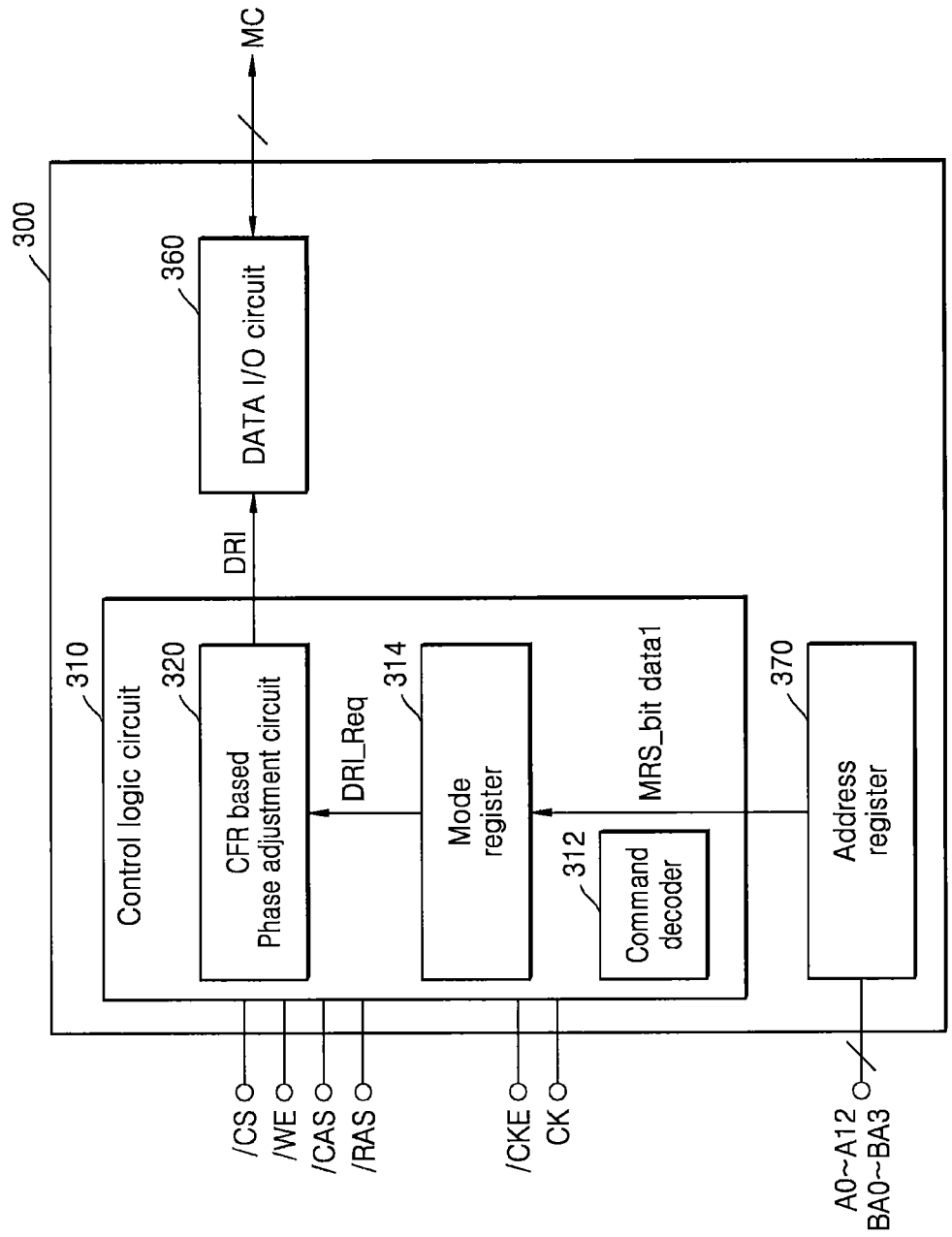
FIGS. 13A and 13B are diagrams for explaining a method of transmitting division ratio information to a memory controller by a memory device according to an embodiment.
Figure 13B:
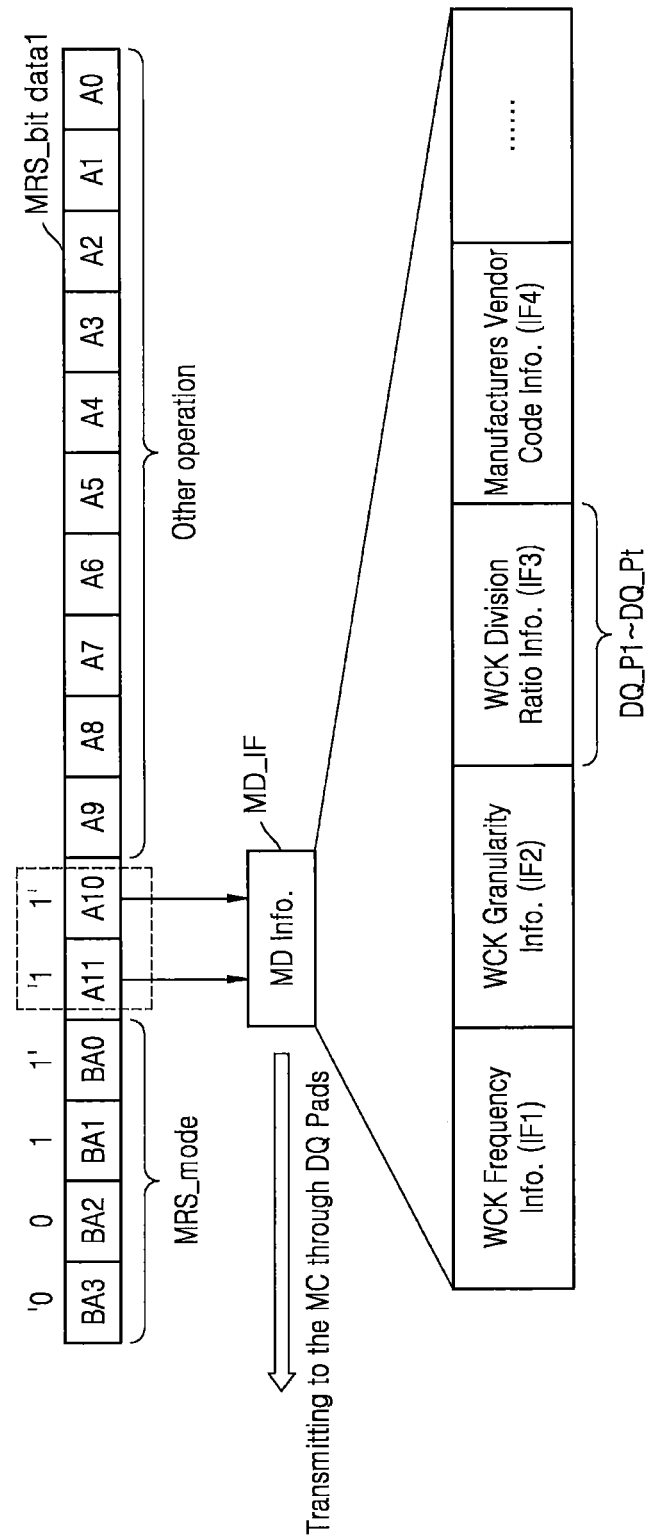

FIGS. 13A and 13B are diagrams for explaining a method of transmitting division ratio information DRI to a memory controller MC by a memory device 300 according to an embodiment.

Referring to FIG. 13A, the memory device 300 may include a control logic circuit 310, a data I/O circuit 360, and an address register 370. The control logic circuit 310 may further include a command decoder 312 and a mode register 314 and control the overall operation of the memory device 300. The control logic circuit 310 may receive signals related to commands CMD, which are applied from the memory controller MC, for example, a chip selection signal /CS, a row address strobe signal /RAS, a column address strobe signal /CAS, a write enable signal /WE, and a clock enable signal /CKE, decode the received signals, and internally generate the decoded commands.

The address register 370 may receive address signals A0 to A12 and BA0 to BA3 through a plurality of address pads of the memory device 300, synchronize the received address signals A0 to A12 and BA0 to BA3 with a main clock signal CK or an inverted clock signal, and provide the synchronized address signals to the control logic circuit 310. The memory controller MC may transmit first mode-register-set (MRS) bit data MRS_bit data1 to the memory device 300 to request the division ratio information DRI for coarse training from the memory device 300. The address register 370 may receive the first MRS bit data MRS_bit data1 through address pads. The address register 370 may provide the first MRS bit data MRS_bit data1 to the mode register 314. The first MRS bit data MRS_bit data1 may be a mode register signal or an MRS command for designating an MRS mode of the memory device 300. The mode register 314 may provide a division ratio information request signal DRI_Req to the phase adjustment circuit 320 in response to the first MRS bit data MRS_bit data1. The phase adjustment circuit 320 may provide the division ratio information DRI to the data I/O circuit 360 in response to the division ratio information request signal DRI_Req. The data I/O circuit 360 may transmit the division ratio information DRI to the memory controller MC through at least one of a plurality of data pads of the memory device 300. In an embodiment, the number of data pads allocated to transmit the division ratio information DRI may vary according to the bit number of the division ratio information DRI. For example, as the number of bits in the division ratio information DRI increases, the number of data pads allocated to transmit the division ratio information DRI may further increase.

In another embodiment, the memory device 300 may transmit the division ratio information DRI to the memory controller MC through an interface (e.g., a joint technology exchange group (JTEG) interface) used to test the memory device 300. Also, the memory device 300 may transmit the division ratio information DRI to the memory controller MC through an additional pad (or an additional pin) of the memory device 300. In an example, the memory device 300 may transmit the division ratio information DRI to the memory controller MC through additional pins including a data bus inversion (DBI) pin, an error detection code (EDC) pin, and a test data out (TDO) pin. In addition, the memory device 300 may transmit the division ratio information DRI to the memory controller MC in various manners.

Unlike FIG. 13A that illustrates an embodiment in which the memory device 300 transmits the division ratio information DRI to the memory controller MC through the additional pad (or the additional pin), FIG. 13B illustrates an embodiment in which division ratio information IF3 is included in memory device information MD_IF, which is transmitted by the memory device 300 to the memory controller MC in a predetermined operation mode. Referring further to FIG. 13B, the first MRS bit data MRS_bit data1 may be divided into an address code portion including address codes A0 to A12 and a bank address code portion including bank address codes BA0 to BA3. The bank address codes BA0 to BA3 of the bank address code portion may designate an MRS mode MRS_mode. Also, the address codes A0 to A12 of the address code portion may designate an operation code of the MRS mode MRS_mode that is designated by the bank address codes BA0 to BA3.

In an embodiment, when the bank address codes BA0 to BA3 of the bank address code portion have a value '0011,' the MRS mode MRS mode of the memory device 300 may be designated as a first MRS mode. When the address codes 'A11 and A10' have a value '11,' the memory device 300 may operate in a first operation mode to transmit the memory device information MD_IF to the memory controller MC. The address codes 'A0 to A9' may designate another operation mode (e.g., a self-refresh mode and an internal clock mode). The memory device information MD_IF may include data clock frequency information IF1, data clock granularity information IF2, division ratio information IF3, and vendor code information IF4. The memory device 300 may transmit the memory device information MD_IF to the memory controller MC through a plurality of data pads. In this case, the division ratio information IF3 may be transmitted to the memory controller MC through a previously allocated data pad DQ_P1 or a plurality of data pads DQ_P1 to DQ_Pt.

Figure 14A:
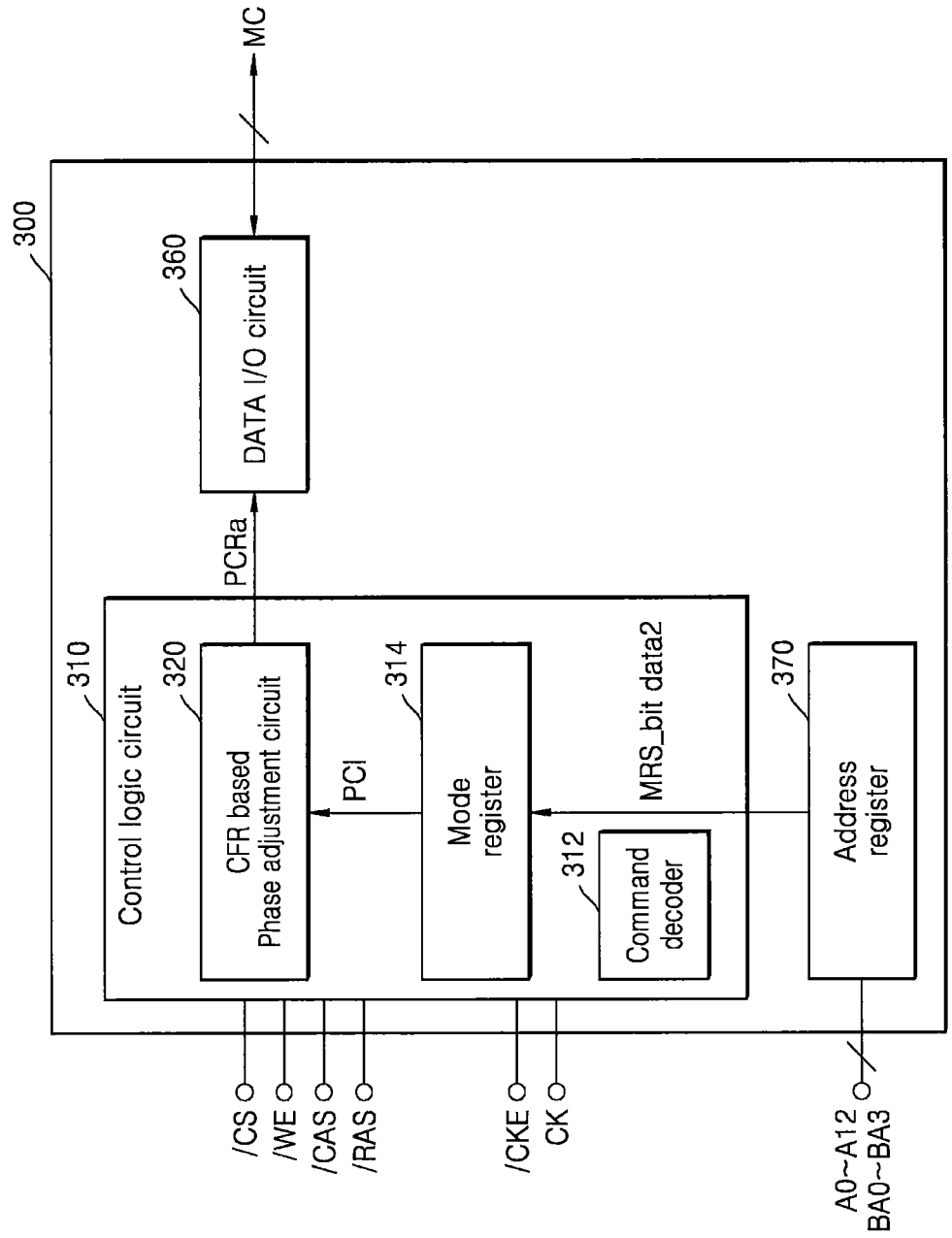
FIGS. 14A and 14B are diagrams for explaining a method of receiving phase control information from a memory controller by a memory device according to an embodiment.
Figure 14B:
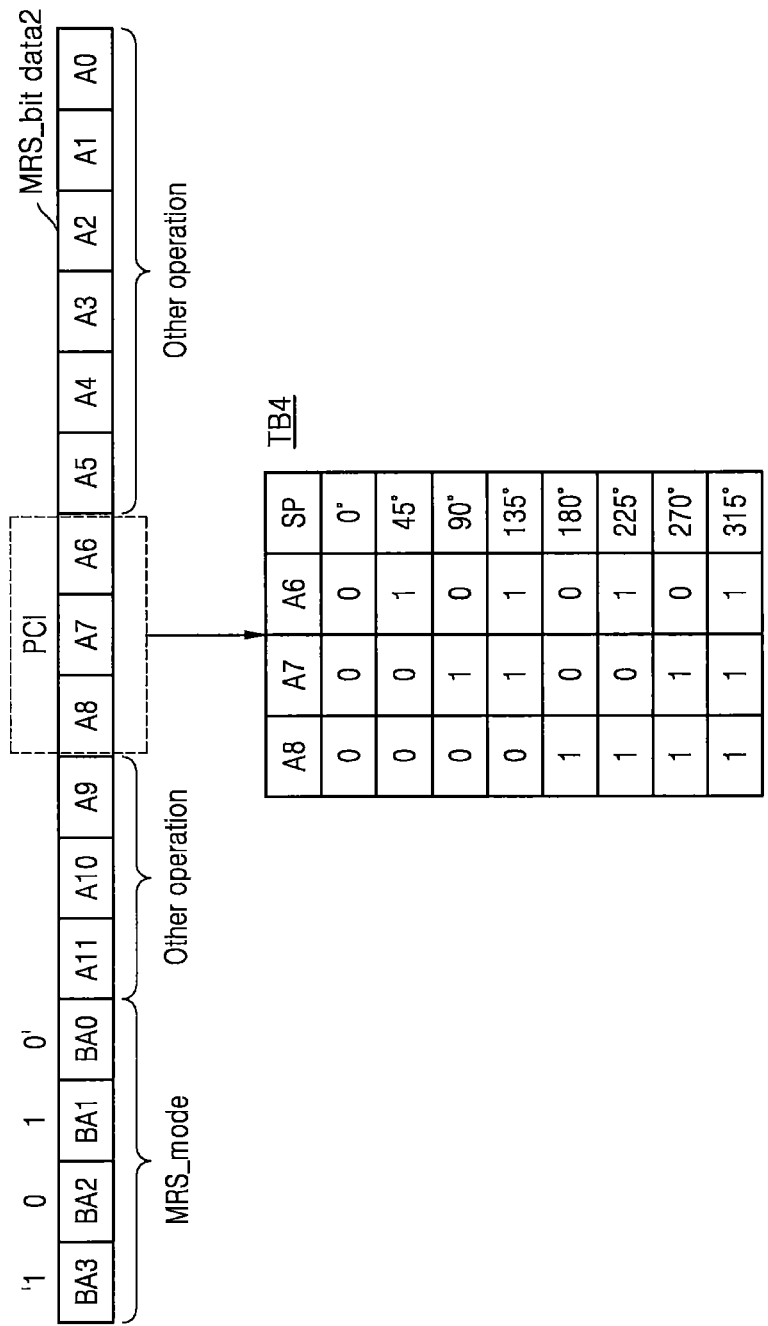

FIGS. 14A and 14B are diagrams for explaining a method of receiving phase control information PCI from a memory controller MC by a memory device 300 according to an embodiment. Since configurations described with reference to FIG. 13A are applicable to the memory device 300, detailed configurations of the memory device 300 will be omitted below.

Referring to FIG. 14A, the memory controller MC may transmit second MRS bit data. MRS_bit data2 including phase control information PCI for coarse training to the memory device 300. The address register 370 may receive second MRS bit data MRS_bit data2 through address pads. The address register 370 may provide the second MRS bit data MRS_bit data2 to the mode register 314. The second MRS_bit data MRS_bit data2 may be a mode register signal or an MRS command for designating an MRS mode of the memory device 300.

The mode register 314 may obtain phase control information PCI from the second MRS bit data MRS_bit data2 in response to the second MRS bit data MRS_bit data2. Specifically, the mode register 314 may obtain the phase control information PCI from the second MRS bit data MRS_bit data2 with reference to an MRS set in the mode register 314. The mode register 314 may provide the obtained phase control information PCI to the phase adjustment circuit 320. The phase adjustment circuit 320 may generate a comparison target clock signal based on the phase control information PCI and a predetermined division ratio, compare a phase of the comparison target clock signal with a phase of a main clock signal CK, and generate a phase comparison result PCRa. The phase adjustment circuit 320 may provide the phase comparison result PCRa to the data I/O circuit 360, and the data I/O circuit 360 may transmit the phase comparison result PCRa to the memory controller MC through at least one a plurality of data pads.

FIG. 14B illustrates second MRS bit data MRS_bit data2 of FIG. 14A, according to an embodiment. Referring further to FIG. 14B, the second MRS bit data MRS_bit data2 may be divided into an address code portion including address codes A0 to A12 and a bank address code portion including bank address codes BA0 to BA3. The bank address codes BA0 to BA3 of the bank address code portion may designate an MRS mode MRS_mode. Also, the address codes A0 to A12 of the address code portion may designate an operation code of the MRS mode MRS_mode designated by the bank address codes BA0 to BA3 of the bank address code portion.

In an embodiment, when the bank address codes BA0 to BA3 of the bank address code portion have a value '1010,' the MRS mode MRS_mode of the memory device 300 may be designated as a second MRS mode. In this case, some address codes may correspond to phase control information PCI. In an example, assuming that a division ratio is set to '1:8,' a 3-bit value of the address codes 'A8, A7, and A6' may correspond to a value of the phase control information PCI.

A fourth table TB4 may include information about a mapping relationship between the address codes 'A8, A7, and A6' and respective shift phases SP. The fourth table TB4 may be stored in a partial memory area of the memory device 300.

The phase adjustment circuit 320 may select any one of a plurality of phases based on the phase control information PCI, which is obtained based on the second MRS bit data MRS_bit data2 with reference to the fourth table TB4, and generate a comparison target clock signal.

Figure 15:
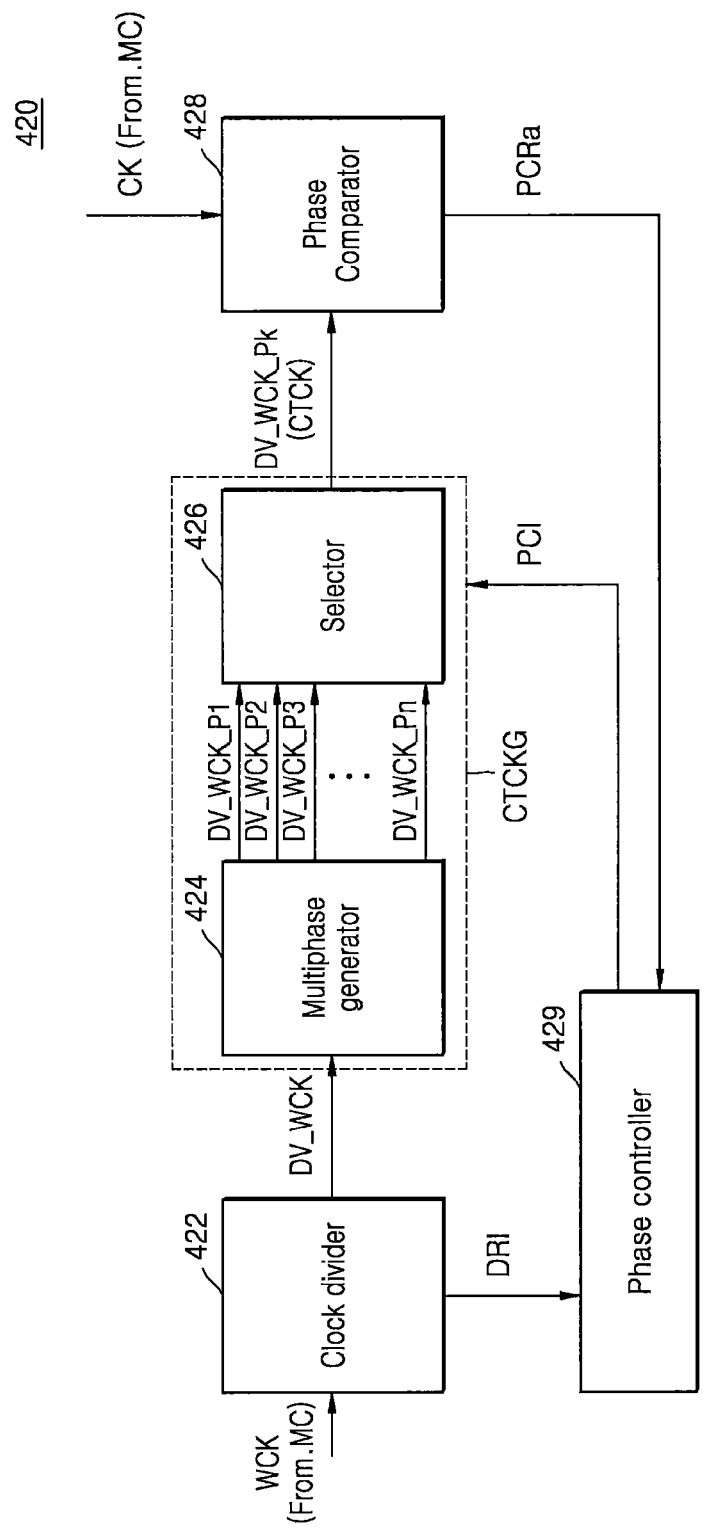
FIG. 15 is a block diagram of a phase adjustment circuit, illustrating an operation of performing independent coarse training by a memory device according to an embodiment.

FIG. 15 is a block diagram of a phase adjustment circuit 420, illustrating an operation of performing independent coarse training by a memory device according to an embodiment.

Referring to FIG. 15, the memory device may include a phase adjustment circuit 420, and the phase adjustment circuit 420 may include a clock divider 422, a comparison target clock generating unit CTCKG, a phase comparator 428, and a phase controller 429.

In an embodiment, the clock divider 422 may receive a data clock signal WCK from a memory controller MC, set a division ratio based on a frequency ratio of a main clock signal CK to the data clock signal WCK, divide the data clock signal WCK based on the division ratio, generate a division data clock signal DV_WCK, and provide the division data clock signal DV_WCK to the comparison target clock generating unit CTCKG. Also, the clock divider 422 may generate division ratio information DRI and transmit the division ratio information DRI to the phase controller 429.

The phase controller 429 may generate phase control information PCI based on division ratio information DRI and provide the phase control information PCI to the comparison target clock generating unit CTCKG. The comparison target clock generating unit CTCKG may include a multiphase generator 424 and a selector 426. The multiphase generator 424 may generate division data clock signals DV_WCK_P1 to DV_WCK_Pn, which are shifted from the division data clock signal DV_WCK by respective phases between which a unit interval is set based on the division ratio, and provide the shifted division data clock signals DV_WCK_P1 to DV_WCK_Pn to the selector 426. The selector 426 may select any one signal DV_WCK_Pk as a comparison target clock signal CTCK based on the phase control information PCI, from among a plurality of shifted division data clock signals DV_WCK_P1 to DV_WCK_Pn, and provide the selected signal DV_WCK_Pk to the phase comparator 428.

The phase comparator 428 may compare a phase of the main clock signal CK received from the memory controller MC with a phase of the comparison target clock signal CTCK, generate a phase comparison result PCRa, and provide the phase comparison result PCRa to the phase controller 429. The phase controller 429 may generate the next phase control information PCI based on at least one of the phase comparison result PCRa and the division ratio information DRI and provide the generated phase control information PCI to the comparison target clock generating unit CTCKG.

Figure 16:
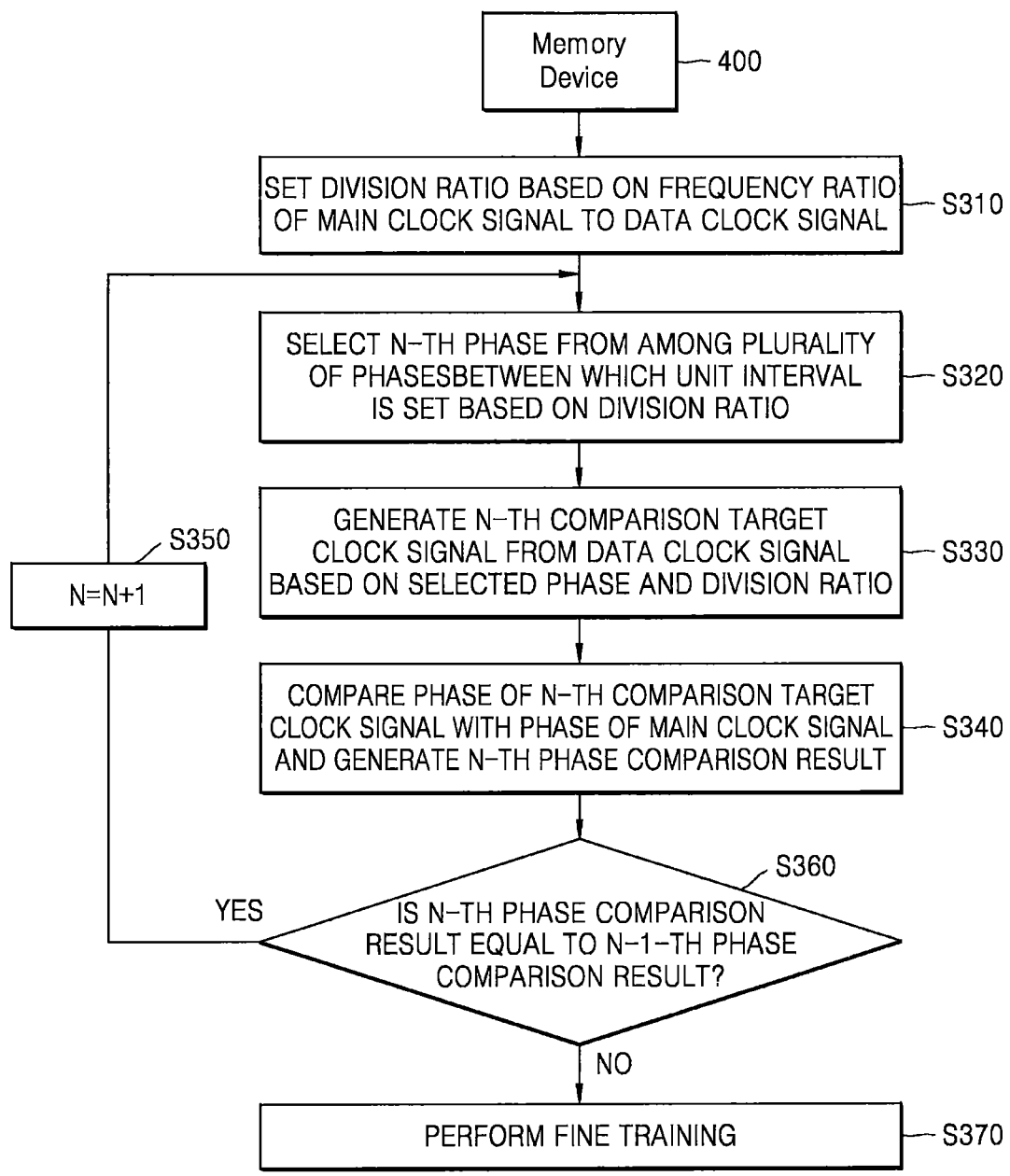
FIG. 16 is a flowchart of an operation of performing independent coarse training by a memory device according to an embodiment.

FIG. 16 is a flowchart of an operation of performing independent coarse training by a memory device 400 according to an embodiment.

Referring to FIG. 16, the memory device 400 may set a division ratio based on a frequency ratio of a main clock signal to a data clock signal (S310). The memory device 400 may select an N-th phase from a plurality of phases between which a unit interval is set based on the division ratio (S320). The memory device 400 may generate an N-th comparison target clock signal from the data clock signal based on the selected phase and the division ratio (S330). The memory device 400 may compare a phase of the N-th comparison target clock signal with a phase of the main clock signal and generate an N-th phase comparison result (S340). It may be determined whether the N-th phase comparison result is equal to a previously generated N−1-th phase comparison result (S360). If the N-th phase comparison result is equal to the previously generated N−1-th phase comparison result or if no phase comparison result is generated before the N-th phase comparison result (refer to YES of S360), 1 may be counted up to N (S350), and operation S320 may be performed. If the N-th phase comparison result is different from the previously generated N−1-th phase comparison result (refer to NO of S360), the memory device 400 may perform fine training along with a memory controller (S370).

As described above, the memory device 400 according to the present embodiment may independently perform coarse training without control by the memory controller. Thus, the load of the memory controller may be reduced, and furthermore, the performance of a memory system may be improved.

Figure 17:
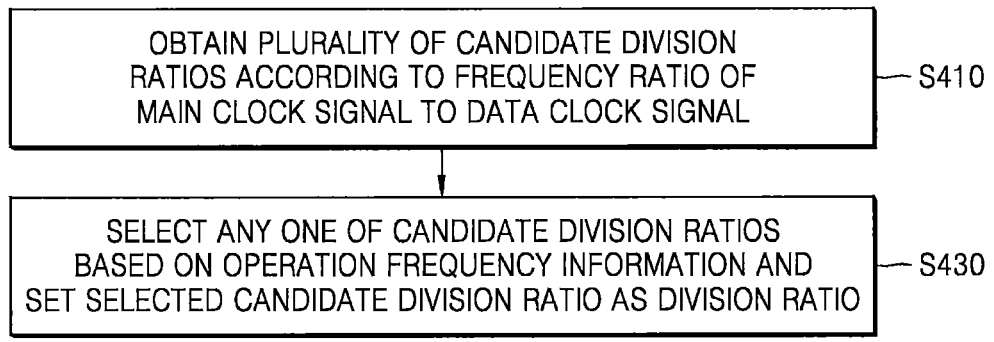
FIG. 17 is a flowchart of a method of setting a division ratio according to an embodiment.

FIG. 17 is a flowchart of a method of setting a division ratio according to an embodiment.

Referring to FIG. 17, a memory device may obtain a plurality of candidate division ratios based on a frequency ratio of a main clock signal and a data clock signal that are received from a memory controller (S410). For example, when the frequency ratio of the main clock signal to the data clock signal is '1:8,' the candidate division ratios may include '1:2,' '1:4,' and '1:8.' The memory device may select any one of the candidate division ratios based on operation frequency information and set the selected candidate division ratio as a division ratio (S430). The operation frequency information may be an indicator of an operation frequency area of the memory device and be set based on MRS bit data received from the memory controller. In an example, the operation frequency information may include information (e.g., column access strobe (CAS) latency and a write recovery time) related to an operation frequency of the memory device.

Figures 18A, 18B:
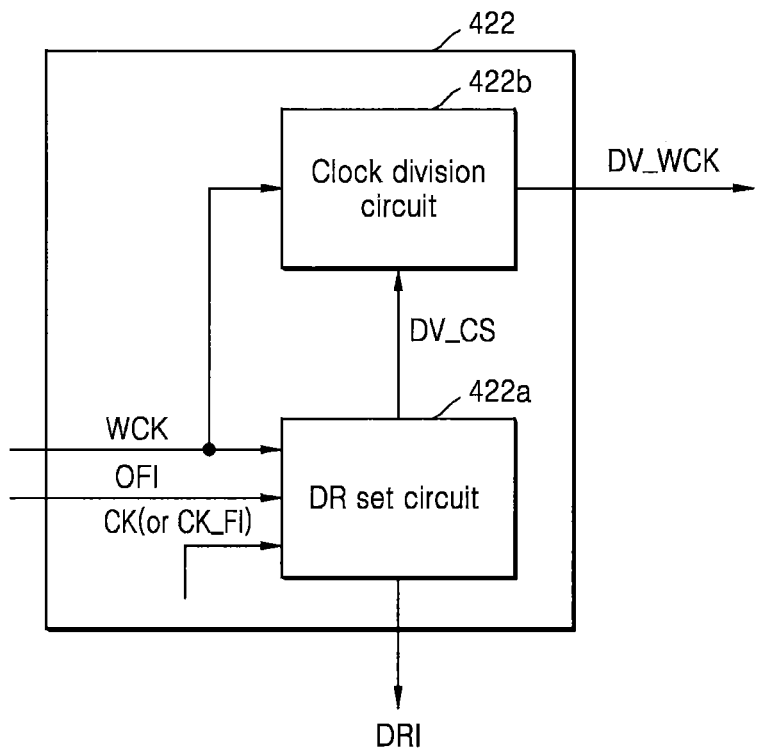
FIGS. 18A and 18B are diagrams for explaining a method of setting a division ratio by a clock divider, according to an embodiment.
Figure 18C:
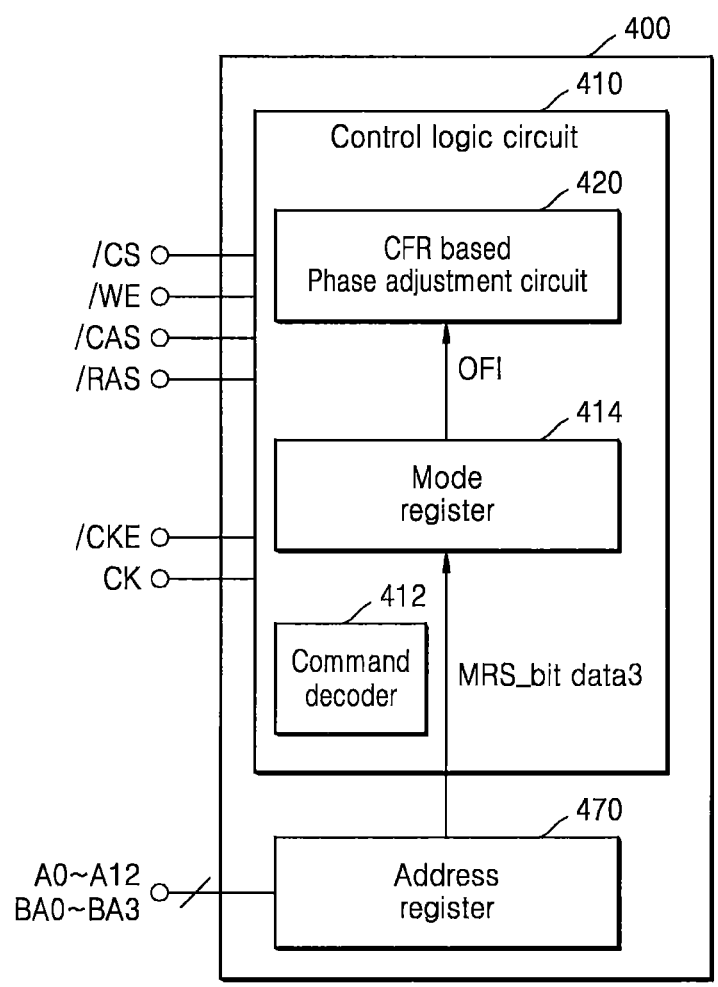
FIG. 18C is a diagram for explaining operation frequency information received by a phase adjustment circuit, according to an embodiment.

FIGS. 18A and 18B are diagrams for explaining a method of setting a division ratio by a clock divider 422, according to an embodiment, and FIG. 18C is a diagram for explaining operation frequency information OFI received by a phase adjustment circuit 420, according to an embodiment.

Referring to FIG. 18A, the clock divider 422 of a phase adjustment circuit may include a DR set circuit 422a and a clock division circuit 422b. The DR set circuit 422a may receive a data clock signal WCK, a main clock signal CK, and the operation frequency information OFI. The DR set circuit 422a may obtain a plurality of candidate division ratios based on the data clock signal WCK and the main clock signal CK. When it is assumed that a frequency ratio of the data clock signal WCK to the main clock signal CK is 'L:1,' candidate division ratios CDR shown in Table TB4 of FIG. 18B may be obtained. The DR set circuit 422a may select any one of the candidate division ratios CDR of '1:2,' '1:4,' . . . , and '1:L' and set the selected candidate division ratio CDR as a division ratio DR. Furthermore, the DR set circuit 422a may set a division ratio DR based on an operation frequency area of a memory device. To this end, the DR set circuit 422a may set the division ratio DR by using the operation frequency information OFI.

In an example, when an operation frequency of the memory device is set to a high value, the DR set circuit 422a may select a low candidate division ratio CDR from among the candidate division ratios CDR and set the low candidate division ratio CDR as the division ratio DR. When the operation frequency of the memory device is set to a low value, the DR set circuit 422a may select a high candidate division ratio CDR from among the candidate division ratios CDR and set the high candidate division ratio CDR as the division ratio DR. The above-described operations of the DR set circuit 422a will be described in detail below with reference to FIGS. 19A and 19B.

The clock division circuit 422b may divide the data clock signal WCK based on the division ratio DR set by the DR set circuit 422a. Since operations of the clock divider 422, which are not described with reference to FIGS. 18A and 18B, are the same as or similar to those of the clock divider 222 of FIG. 7A, detailed descriptions thereof will be omitted.

Referring further to FIG. 18C, a memory device 400 may include a control logic circuit 410, a data I/O circuit 460, and an address register 470. The control logic circuit 410 may include a command decoder 412, a mode register 414, and a phase adjustment circuit 420. Since respective components of the memory device 400 are the same as or similar to those of the memory device 300 of FIG. 13A, differences therebetween will chiefly described.

A memory controller may transmit third MRS bit data MRS_bit data3 for setting an operation memory area of the memory device 400 to the memory device 400. The address register 470 may receive the third MRS bit data MRS_bit data3 through address pads. The address register 470 may provide the third MRS bit data MRS_bit data3 to the mode register 414. The mode register 414 may set information related to an operation frequency of the memory device 400 based on the third MRS bit data MRS_bit data3. The mode register 414 may provide operation frequency information OFI indicating information related to the operation frequency to the phase adjustment circuit 420. The phase adjustment circuit 420 may set a division ratio based on the operation frequency information OFI as shown in FIG. 18A. Since a training operation performed by a memory device based on a set division ratio is described above in detail with reference to FIG. 1, descriptions thereof will be omitted.

Figure 19A:
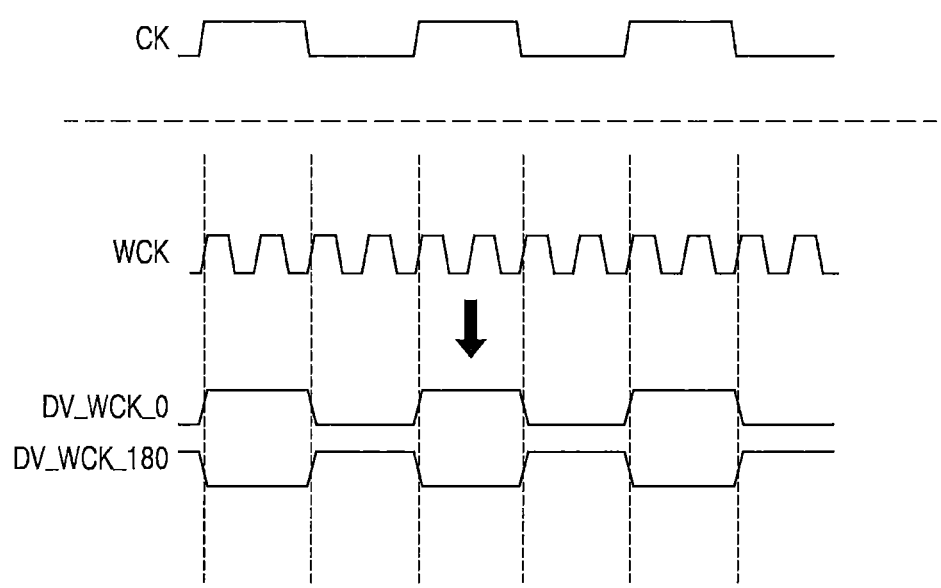
FIGS. 19A and 19B are waveform diagrams of shifted division clock signals for explaining operations of a division ratio (DR) set circuit of FIG. 18A when a frequency ratio of a data clock signal to a main clock signal is 4:1.
Figure 19B:
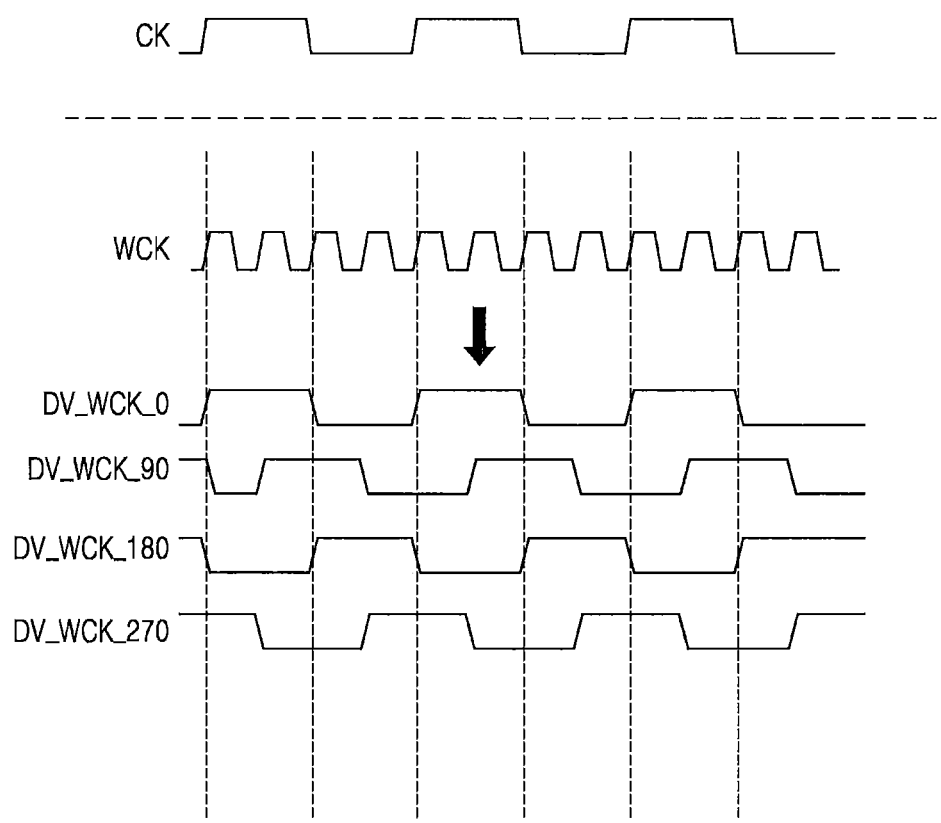

FIGS. 19A and 19B are waveform diagrams of shifted division clock signals for explaining operations of the DR set circuit 422a of FIG. 18A when a frequency ratio of a data clock signal WCK to a main clock signal CK is 4:1.

Referring to FIGS. 18A, 19A, and 19B, when the frequency ratio of the data clock signal WCK to the main clock signal CK is '4:1,' the DR set circuit 422a may select any one of candidate division ratios including '1:2' and '1:4' and set the selected candidate division ratio as a division ratio. The DR set circuit 422a may set the division ratio based on operation frequency information OFI. Specifically, the DR set circuit 422a may recognize an operation frequency of a memory device based on the operation frequency information OFI. When the operation frequency of the memory device is less than a critical value, the DR set circuit 422a may select a candidate division ratio of '1:2' and set the candidate division ratio of '1:2' as the division ratio as shown in FIG. 19A. When the operation frequency of the memory device is equal to or higher than the critical value, the DR set circuit 422a may select a candidate division ratio of '1:4' and set the candidate division ratio of '1:4' as the division ratio as shown in FIG. 19B. However, the present embodiment is only an example embodiment, and the inventive concept is not limited thereto. The frequency ratio of the data clock signal WCK to the main clock signal CK may have various values and thus, the DR set circuit 422a may set one of various candidate division ratios as the division ratio based on the operation frequency of the memory device.

Figure 20:
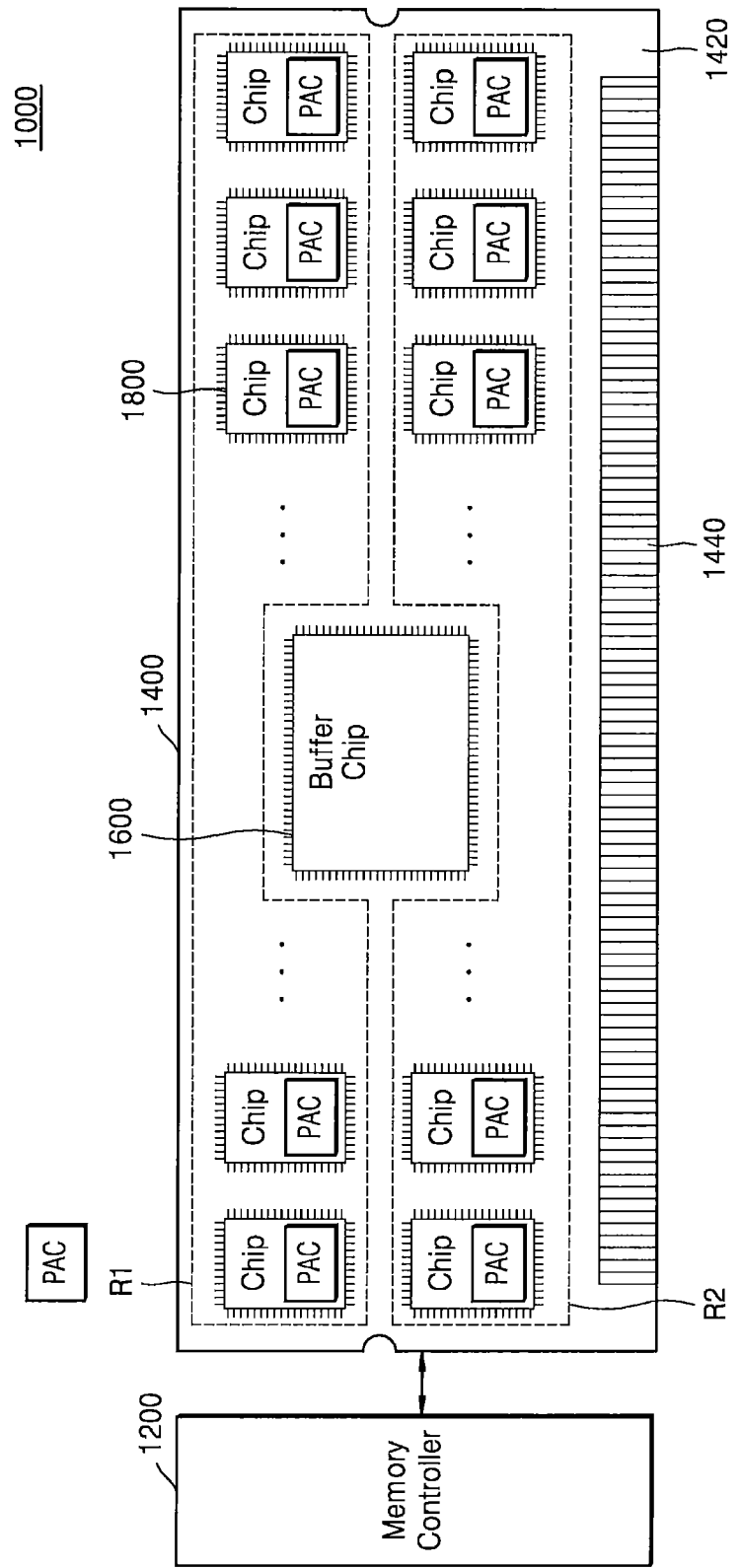
FIG. 20 is a block diagram of a memory system according to an embodiment.

FIG. 20 is a block diagram of a memory system 1000 according to an embodiment.

Referring to FIG. 20, the memory system 1000 may include a memory controller 1200 and a memory module 1400. The memory module 1400 may include at least two memory chips 1800, each of which includes a memory cell array, and a buffer chip 1620 configured to route transceiving signals between the memory chips 1800 and the memory controller 1200 or manage a memory operation on the memory chips 1800. The memory chips 1800 of the memory module 1400 may be divided into a first rank R1 and a second rank R2. The memory controller 1200 may provide a main clock signal and a data clock signal having different frequencies to the memory chips 1800. Each of the memory chips 1800 may include a phase adjustment circuit PAC. The embodiments described with reference to FIGS. 1 to 16 may be applied to the phase adjustment circuit PAC so that the phase adjustment circuit PAC may perform a training operation for alignment between the main clock signal and the data clock signal in the memory chip 1800. Although FIG. 17 illustrates an example in which some of functions of the memory controller are performed by a memory module of a load-reduced dual in-line memory module (LRDIMM) type, embodiments of the inventive concept are not limited thereto. For example, a memory module of a fully buffered DIMM (FBDIMM) type may be applied, and an advanced memory buffer (AMB) chip may be mounted as a buffer chip on the memory module. In addition, a memory module of another type may be applied, and at least some of the above-described functions of the memory controller may be performed by the memory module.

Figure 21:
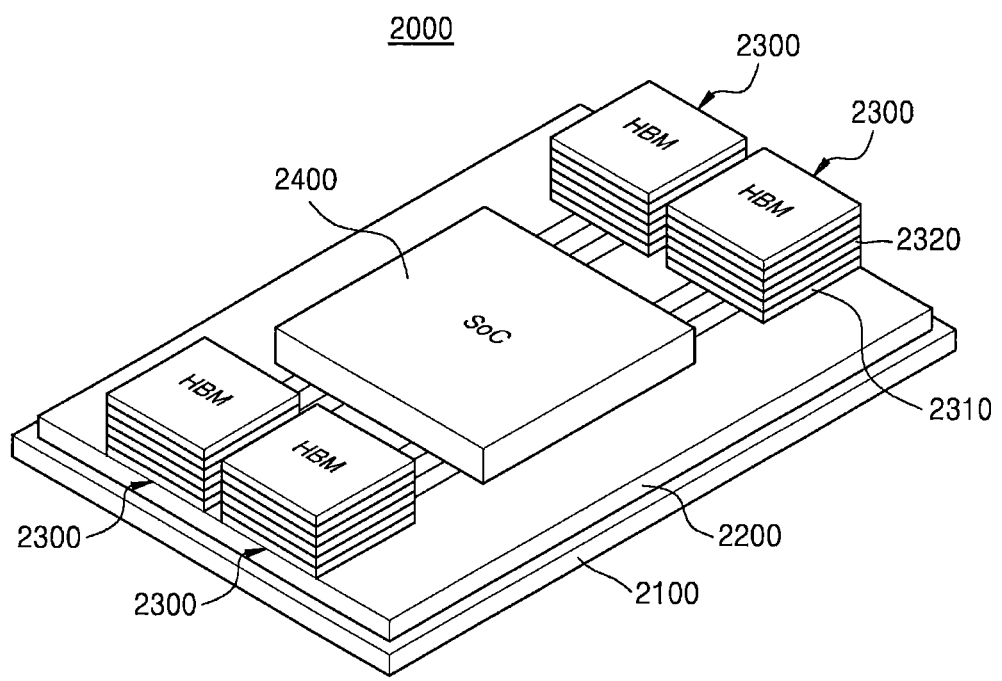
FIG. 21 is a diagram of a semiconductor package including a stack semiconductor chip according to an embodiment.

FIG. 21 is a diagram of a semiconductor package 2000 including a stack semiconductor chip 2300 according to an embodiment.

Referring to FIG. 21, the semiconductor package 2000 may be a memory module including at least one stack semiconductor chip 2300 and a System-on-Chip (SoC) 2400, which are mounted on a package substrate 2100, such as a printed circuit board (PCB). An interposer 2200 may be optionally further provided on the package substrate 2100.

The at least one stack semiconductor chip 2300 may be implemented as a Chip-on-Chip (CoC). The at least one stack semiconductor chip 2300 may include at least one memory chip 2320 stacked on a buffer chip 2310, such as a logic chip. The buffer chip 2310 and the at least one memory chip 2320 may be connected to each other by through-silicon vias (TSVs). The SoC 2400 may provide a main clock signal and a data clock signal having different frequencies to each of the memory chips 2320. Each of the at least one memory chip 2320 may include a phase adjustment circuit. The embodiments described above with reference to FIGS. 1 to 16 may be applied to the phase adjustment circuit so that the phase adjustment circuit may perform a training operation for aligning the main clock signal with the data clock signal in the memory chip 2320. In an example, the stack semiconductor chip 3300 may be a high-bandwidth memory (HBM) having a bandwidth of about 500 GB/sec to 1 TB/sec or higher.

While the inventive concept has been particularly shown and described with reference to embodiments thereof, it will be understood that various changes in form and details may be made therein without departing from the spirit and scope of the following claims.

What is claimed is:

1. A method of operating a memory device configured to perform first training comprising a plurality of loop operations to align a main clock signal and a data clock signal, which are received from a memory controller, the method comprising generating division ratio information indicating a division ratio set based on a frequency ratio of the main clock signal to the data clock signal and transmitting the division ratio information to the memory controller to perform the first training,
   wherein a first loop operation of the loop operations comprises:
   receiving first phase control information from the memory controller, the first phase control information being generated based on the division ratio information;
   dividing the data clock signal based on the division ratio to generate a division data clock signal, selecting a first phase from among a plurality of phases based on the first phase control information, and generating a first comparison target clock signal, the first comparison target clock signal being shifted from the division data clock signal by the first phase; and
   comparing a phase of the first comparison target clock signal with a phase of the main clock signal and transmitting a first phase comparison result to the memory controller.

2. The method of claim 1, wherein a bit number of the division ratio information is set according to a division ratio range that is supportable by the memory device.

3. The method of claim 2, wherein, as the division ratio range widens, the bit number of the division ratio information is set to a greater bit number.

4. The method of claim 1, wherein the transmitting of the division ratio information to the memory controller comprises transmitting the division ratio information to the memory controller through at least one data pad allocated to transmit the division ratio information, from among a plurality of data pads of the memory device.

5. The method of claim 4, wherein the number of data pads allocated to transmit the division ratio information varies according to the bit number of the division ratio information.

6. The method of claim 1, wherein the transmitting of the division ratio information to the memory controller comprises transmitting the division ratio information to the memory controller through an interface used to test the memory device.

7. The method of claim 1, wherein the transmitting of the division ratio information to the memory controller comprises:
   receiving mode register set (MRS) bit data for requesting the transmission of the division ratio information, from the memory controller; and
   transmitting information including the division ratio information.

8. The method of claim 1, wherein a unit interval between the plurality of phases is set according to the division ratio.

9. The method of claim 1, wherein the bit number of the first phase control information is set according to the division ratio or the division ratio range that is supportable by the memory device.

10. The method of claim 1, wherein the receiving of the first phase control information comprises:
    receiving mode register set (MRS) bit data including the first phase control information from the memory controller; and
    obtaining the first phase control information from the MRS bit data with reference to an MRS of the memory device.

11. The method of claim 1, wherein a second loop operation of the loop operations comprises:
    receiving second phase control information from the memory controller, the second phase control information being generated based on the first phase comparison result;
    selecting a second phase of the phases based on the second phase control information and generating a second comparison target clock signal, the second comparison target clock signal being shifted from the division data clock signal by the second phase; and
    comparing a phase of the second comparison target clock signal with the phase of the main clock signal and transmitting the second phase comparison result to the memory controller.

12. The method of claim 1, wherein the generating of the division ratio information and the transmitting of the division ratio information to the memory controller comprise selecting any one candidate division ratio based on operation frequency information of the memory device, from among a plurality of candidate division ratios according to the frequency ratio of the main clock signal to the data clock signal, and setting the selected candidate division ratio as the division ratio.

13. The method of claim 12, wherein the operation frequency information is set based on mode register set (MRS) bit data received from the memory controller and includes information related to an operation frequency of the memory device.

14. A method of operating a memory device, the method comprising:
    receiving a main clock signal and a data clock signal for a memory operation from a memory controller;
    selecting any one of a plurality of candidate division ratios according to a frequency ratio of the main clock signal to the data clock signal as a division ratio and generating division ratio information indicating the division ratio and transmitting the division ratio information to the memory controller; and
    receiving phase control information from the memory controller and performing first training by using a comparison target clock signal that is generated from the data clock signal based on the division ratio and the phase control information, the phase control information being generated based on the division ratio information.

15. The method of claim 14, wherein the comparison target clock signal is a signal that is shifted from a division data clock signal by a phase that is selected from among a plurality of phases based on the phase control information, the division data clock signal being generated by dividing the data clock signal based on the division ratio.

16. The method of claim 15, wherein the respective phases are separated from one another by a unit interval, and
the comparison target clock signal is generated by selecting a phase corresponding to a bit value of the phase control information from among the phases.

17. The method of claim 14, wherein the selecting of any one of the candidate division ratios as the division ratio comprises selecting any one of the candidate division ratios as the division ratio based on an operation frequency area of the memory device.

18. A memory device configured to perform a memory operation by using a main clock signal and a data clock signal that are received from a memory controller, the memory device comprising a phase adjustment circuit configured to generate a comparison target clock signal based on a frequency ratio of the main clock signal to the data clock signal to perform first training,
wherein the phase adjustment circuit generates division ratio information indicating a division ratio set based on the frequency ratio, transmitting the division ratio information to the memory controller, receiving phase control information from the memory controller, and generating the comparison target clock signal from the data clock signal based on the division ratio and the phase control information, the phase control information being generated based on the division ratio information.

19. The memory device of claim 18, further comprising a plurality of data pads configured to transmit and receive data to and from the memory controller,
wherein the memory device transmits the division ratio information to the memory controller through at least one of the data pads.

20. The memory device of claim 18, further comprising a plurality of address pads configured to receive addresses from the memory controller,
wherein the memory device receives the phase control information through at least one of the address pads.

* * * * *